United States Patent
Yoshiwara et al.

(10) Patent No.: US 12,162,989 B2
(45) Date of Patent: Dec. 10, 2024

(54) DISPERSION LIQUID, CONDUCTIVE FILM AND PRODUCTION METHOD THEREOF, ELECTRODE, AND SOLAR CELL

(71) Applicant: ZEON CORPORATION, Tokyo (JP)

(72) Inventors: Akihiko Yoshiwara, Tokyo (JP); Ryuji Oota, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 685 days.

(21) Appl. No.: 17/424,163

(22) PCT Filed: Jan. 21, 2020

(86) PCT No.: PCT/JP2020/001921
§ 371 (c)(1),
(2) Date: Jul. 20, 2021

(87) PCT Pub. No.: WO2020/158507
PCT Pub. Date: Aug. 6, 2020

(65) Prior Publication Data
US 2022/0098354 A1    Mar. 31, 2022

(30) Foreign Application Priority Data
Feb. 1, 2019    (JP) .................. 2019-017429

(51) Int. Cl.
*C08G 8/18*    (2006.01)
*C08J 5/18*    (2006.01)
(Continued)

(52) U.S. Cl.
CPC .............. *C08G 8/18* (2013.01); *C08J 5/18* (2013.01); *C08K 3/046* (2017.05); *H01B 1/04* (2013.01);
(Continued)

(58) Field of Classification Search
CPC .......... H10K 85/10; H10K 85/20; H01B 1/20; G21H 1/12; C08G 8/18
See application file for complete search history.

(56) References Cited

U.S. PATENT DOCUMENTS

| 3,219,607 A | 11/1965 | Perronin |
| 9,160,002 B2 | 10/2015 | Shibahara et al. |

(Continued)

FOREIGN PATENT DOCUMENTS

| CN | 102246343 A | 11/2011 |
| CN | 102265448 A | 11/2011 |

(Continued)

OTHER PUBLICATIONS

Zyoud, Journal of Energy Storage 25 (2019) 100843, p. 1-9 (Year: 2019).*

(Continued)

*Primary Examiner* — Robert C Boyle
(74) *Attorney, Agent, or Firm* — KENJA IP LAW PC

(57) ABSTRACT

Provided is a dispersion liquid that can improve coatability (wettability) with respect to a base material and can form a conductive film having high close adherence with a base material. The dispersion liquid contains a carbon material (A), a condensate (B) of an aromatic sulfonic acid compound, a hydroxyphenol compound, and an aldehyde compound, and a solvent (C).

1 Claim, 1 Drawing Sheet

(51) Int. Cl.
*C08K 3/04* (2006.01)
*H01B 1/04* (2006.01)
*H01B 13/00* (2006.01)
*H10K 85/10* (2023.01)
*C08K 7/06* (2006.01)

(52) U.S. Cl.
CPC ......... *H01B 13/0036* (2013.01); *H10K 85/10* (2023.02); *C08J 2361/10* (2013.01); *C08K 7/06* (2013.01); *C08K 2201/011* (2013.01)

(56) References Cited

U.S. PATENT DOCUMENTS

| | | |
|---|---|---|
| 9,553,335 B2 | 1/2017 | Kogure et al. |
| 2008/0318049 A1 | 12/2008 | Hata et al. |
| 2013/0022860 A1 | 1/2013 | Minoura et al. |
| 2013/0029210 A1 | 1/2013 | Minoura et al. |
| 2013/0157118 A1* | 6/2013 | Shibahara ............ H01M 10/121 429/163 |
| 2016/0133392 A1 | 5/2016 | Sato et al. |
| 2016/0340521 A1 | 11/2016 | Yoshiwara et al. |
| 2017/0033362 A1* | 2/2017 | Hara ..................... H01M 4/622 |

FOREIGN PATENT DOCUMENTS

| | | |
|---|---|---|
| CN | 102576911 A | 7/2012 |
| CN | 102668197 A | 9/2012 |
| CN | 105683233 A | 6/2016 |
| CS | 214121 B1 | 4/1982 |
| EP | 2500976 A1 | 9/2012 |
| EP | 2544291 A1 | 1/2013 |
| EP | 2544292 A1 | 1/2013 |
| EP | 2658016 A1 | 10/2013 |
| JP | 2009163959 A | 7/2009 |
| JP | 2013041848 A | 2/2013 |
| JP | 2013199419 A | 10/2013 |
| JP | 2014049631 A | 3/2014 |
| JP | 2015046583 A | 3/2015 |
| JP | 2016009737 A | 1/2016 |
| JP | 2017160326 A | 9/2017 |
| WO | 2005031204 A2 | 4/2005 |
| WO | 2006011655 A1 | 2/2006 |
| WO | 2011108175 A1 | 9/2011 |
| WO | 2012042917 A1 | 4/2012 |
| WO | 2013042482 A1 | 3/2013 |
| WO | 2015115102 A1 | 8/2015 |
| WO | 2015156293 A1 | 10/2015 |

OTHER PUBLICATIONS

Feng Jun, Applied Research of Carbon Nanotubes for Solar Cell Counter Electrodes, Chinese Excellent Master's Thesis Full-Text Database Engineering Science and Technology II, C042-871, 2014 06th, 2014.

Sep. 23, 2022, the Extended European Search Report issued by the European Patent Office in the corresponding European Patent Application No. 20749148.1.

Jul. 27, 2021, International Preliminary Report on Patentability issued in the International Patent Application No. PCT/JP2020/001921.

Mar. 31, 2020, International Search Report issued in the International Patent Application No. PCT/JP2020/001921.

* cited by examiner

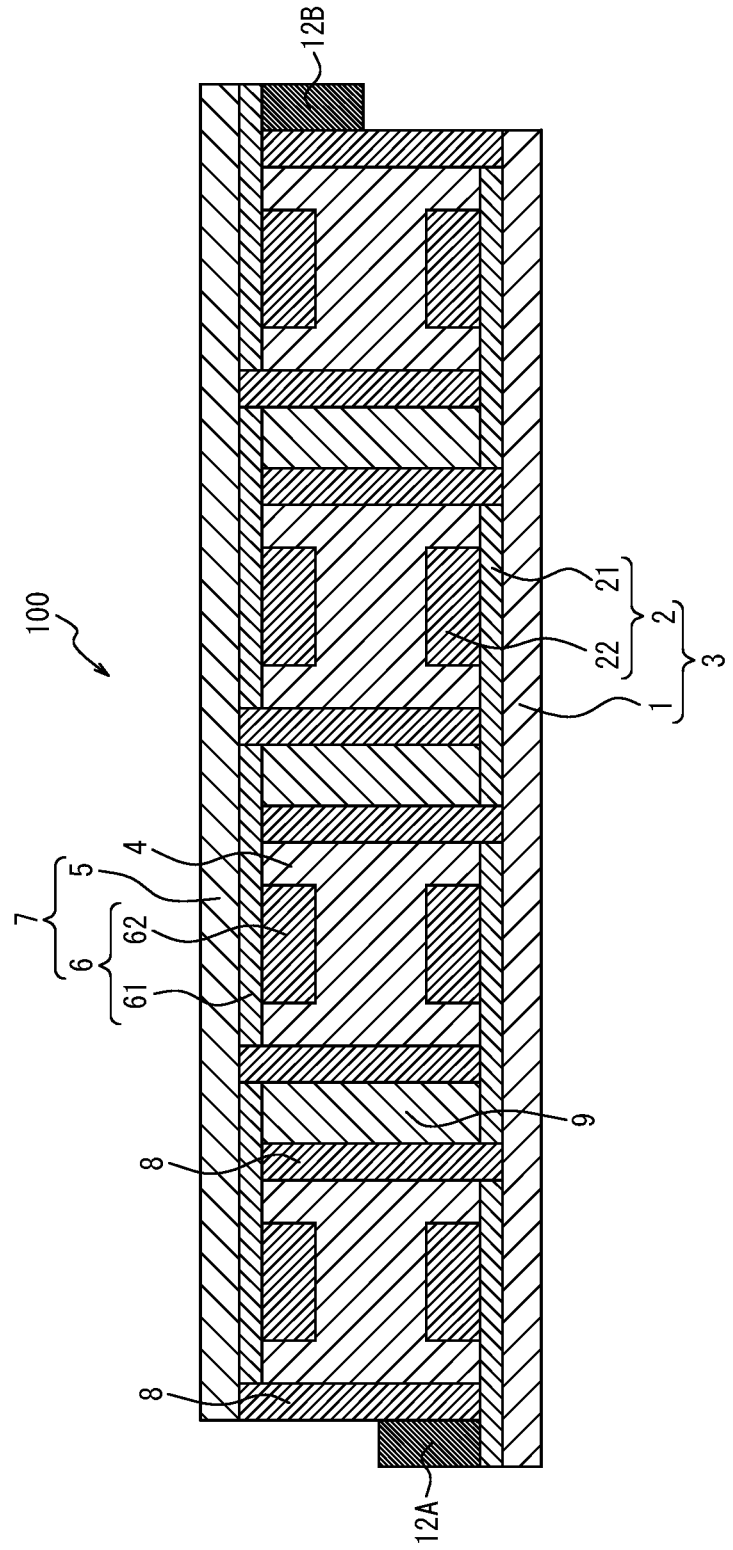

DISPERSION LIQUID, CONDUCTIVE FILM AND PRODUCTION METHOD THEREOF, ELECTRODE, AND SOLAR CELL

TECHNICAL FIELD

The present disclosure relates to a dispersion liquid, a conductive film and production method thereof, an electrode, and a solar cell, and, in particular, relates to a dispersion liquid, a conductive film obtained using the dispersion liquid and a production method thereof, an electrode including the conductive film, and a solar cell including the electrode.

BACKGROUND

Carbon nanotubes (hereinafter, also referred to as "CNTs"), which are one type of carbon material, are being studied for various industrial applications due to excelling in terms of various characteristics such as electrical conductivity, thermal conductivity, and mechanical strength. Focusing on their excellent electrical conductivity, for example, techniques are being studied for using CNTs in the formation of conductive films.

A conductive film that contains CNTs can be formed on a base material by, for example, applying a carbon nanotube dispersion liquid (hereinafter, also referred to as a "CNT dispersion liquid") in which CNTs, a solvent, and a dispersant are compounded onto the base material and then drying the CNT dispersion liquid. Attempts are being made to improve the dispersants and CNT dispersion liquids that are used in order to improve the performance of such conductive films themselves and also of conductive films that include a conductive film on a base material.

As one example, Patent Literature (PTL) 1 discloses a transparent conductive film that includes a conductive film formed of CNTs and an aromatic polymer serving as a dispersant and a layer formed of a resin layer on the conductive film and that has a specific light transmittance and surface resistivity. PTL 1 reports that this transparent conductive film has high durability, high electrical conductivity, and excellent light transmittivity.

As another example, PTL 2 discloses an aqueous CNT dispersion liquid that contains a dispersant having a number-average molecular weight of not less than 10,000 and not more than 150,000, such as a polysaccharide, in a specific proportion relative to CNTs and that is adjusted to a pH within a specific range. PTL 2 reports that this aqueous CNT dispersion liquid has excellent stability under high shear force while maintaining high dispersibility.

As another example, PTL 3 discloses a poly(styrenesulfonic acid) copolymer in which a styrenesulfonic acid monomer residue, a maleimide residue including a substituted or unsubstituted aromatic hydrocarbon group on the nitrogen atom, and another vinyl monomer residue derived from itaconic acid, fumaric acid, or the like, which are each represented by a specific structural formula, are included as repeating structural units in proportions of 30 mol % to 95 mol %, 5 mol % to 70 mol %, and 0 mol % to 20 mol %, respectively. PTL 3 reports that this poly(styrenesulfonic acid) copolymer has high dispersing ability with respect to CNTs or the like in an aqueous medium.

As another example, PTL 4 reports that when a polymeric dispersant formed of a polymer that includes sulfo group-containing monomer units and includes ethylenically unsaturated aliphatic carboxylic acid monomer units in a specific proportion is used as a dispersant when dispersing CNTs in a solvent, aggregation of the CNTs in a CNT dispersion liquid can be inhibited while also achieving excellent adhesiveness between a base material and a conductive film formed using the dispersion liquid.

CITATION LIST

Patent Literature

PTL 1: JP2009-163959A
PTL 2: JP2013-199419A
PTL 3: WO2013/042482A1
PTL 4: WO2015/115102A1

SUMMARY

Technical Problem

It is desirable for a dispersion liquid such as a CNT dispersion liquid to have coatability (wettability) with respect to a base material. Moreover, it is desirable for a conductive film that is formed using a dispersion liquid to have electrical conductivity and excellent close adherence with a base material. Furthermore, in a case in which a conductive film is to be used in a counter electrode of a dye-sensitized solar cell, for example, it is desirable for the conductive film to have excellent catalytic activity. It is also desirable for a solar cell that is produced using a conductive film to have high conversion efficiency.

However, coatability (wettability) of a dispersion liquid with respect to a base material and/or close adherence of a base material and a conductive film formed from a dispersion liquid are still inadequate in the conventional techniques described above. Therefore, there is room for improvement of the conventional techniques described above in terms of improving coatability (wettability) of a dispersion liquid with respect to a base material while also improving close adherence of a base material and a conductive film formed from the dispersion liquid.

Accordingly, one object of the present disclosure is to provide a dispersion liquid that can improve coatability (wettability) with respect to a base material and can form a conductive film having high close adherence with a base material. Another object of the present disclosure is to provide the aforementioned conductive film, an electrode including this conductive film, and a solar cell including this electrode.

Solution to Problem

The inventors conducted diligent studies to achieve the objects set forth above. The inventors discovered that the inclusion of a carbon material (A), a condensate (B) of an aromatic sulfonic acid compound, a hydroxyphenol compound, and an aldehyde compound, and a solvent (C) in a dispersion liquid can improve coatability (wettability) with respect to a base material and enables formation of a conductive film having high close adherence with a base material, and, in this manner, completed the present disclosure.

Specifically, the present disclosure aims to advantageously solve the problems set forth above, and a presently disclosed dispersion liquid comprises: a carbon material (A); a condensate (B) of an aromatic sulfonic acid compound, a hydroxyphenol compound, and an aldehyde compound; and a solvent (C). The inclusion of a carbon material (A), a condensate (B) of an aromatic sulfonic acid compound, a hydroxyphenol compound, and an aldehyde compound, and a solvent (C) in this manner can improve coatability (wettability) with respect to a base material and enables formation of a conductive film having high close adherence with a base material.

Note that the term "aromatic sulfonic acid compound" as used in the present specification refers to a "compound in which any one of the hydrogen atoms of an aromatic compound has been replaced by —$SO_3X$ (X is a hydrogen atom or a cation)", and the term "hydroxyphenol compound" as used in the present specification refers to a "compound including at least one hydroxy group" that is a compound other than an "aromatic sulfonic acid compound".

In the presently disclosed dispersion liquid, a molar ratio of hydroxyphenol compound monomer units derived from the hydroxyphenol compound relative to aromatic sulfonic acid compound monomer units derived from the aromatic sulfonic acid compound (hydroxyphenol compound monomer units/aromatic sulfonic acid compound monomer units) in the condensate (B) is preferably not less than 1/9 and not more than 9/1. When the molar ratio of aromatic sulfonic acid compound monomer units and hydroxyphenol compound monomer units in the condensate (B) is within a specific range, dispersibility of the condensate (B) can be improved, and a conductive film having high close adherence with a base material can be efficiently formed.

In the presently disclosed dispersion liquid, the condensate (B) preferably has a standard polyethylene glycol-equivalent weight-average molecular weight of not less than 500 and not more than 100,000. When the weight-average molecular weight (standard polyethylene glycol-equivalent value) of the condensate (B) is not less than 500 and not more than 100,000, dispersibility of the carbon material can be improved, and coatability (wettability) with respect to a base material can be improved. This enables efficient formation of a conductive film having high close adherence with a base material and makes it possible to obtain a conductive film having improved electrical conductivity and film strength, and also having improved catalytic activity when used as an electrode. Moreover, high conversion efficiency is achieved by a solar cell that is produced using this conductive film.

In the presently disclosed dispersion liquid, the condensate (B) is preferably a resol type.

In the presently disclosed dispersion liquid, the condensate (B) is preferably represented by general formula (1) or general formula (2), shown below,

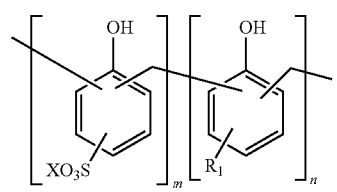

(1)

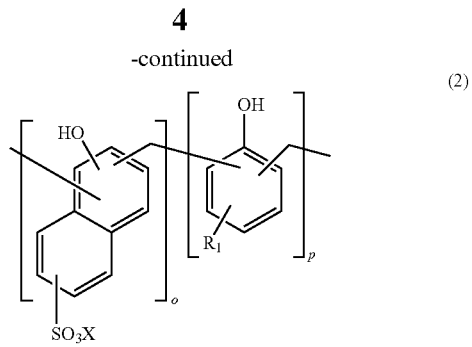

(2)

where, in general formula (1) and general formula (2), X is a hydrogen atom or a cation, m, n, o, and p are each an integer of 1 or more, and $R_1$ is a hydroxy group, —$CH_2$—OH, or a group represented by general formula (3), shown below,

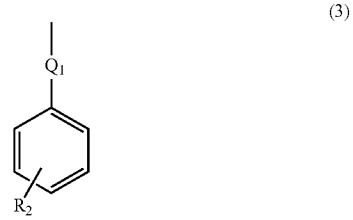

(3)

where, in general formula (3), 1 is an integer of 0 to 4, Q is a divalent organic group, and $R_2$ is a hydroxy group, —$CH_2$—OH, or a hydrogen atom.

In the presently disclosed dispersion liquid, Q in general formula (3) is preferably a sulfonyl group.

In the presently disclosed dispersion liquid, the carbon material (A) is preferably a fibrous carbon nanostructure.

In the presently disclosed dispersion liquid, the solvent (C) preferably includes water, and the dispersion liquid preferably has a pH of lower than 7.

In the presently disclosed dispersion liquid, not less than 50 parts by mass and not more than 500 parts by mass of the condensate (B) is preferably contained per 100 parts by mass of the carbon material (A).

Moreover, the present disclosure aims to advantageously solve the problems set forth above, and a presently disclosed conductive film is obtained using any one of the dispersion liquids set forth above. By using the presently disclosed dispersion liquid, it is possible to provide a conductive film having excellent close adherence with a base material.

Furthermore, the present disclosure aims to advantageously solve the problems set forth above, and a presently disclosed electrode comprises the conductive film set forth above. An electrode that includes the presently disclosed conductive film has excellent electrical conductivity.

Also, the present disclosure aims to advantageously solve the problems set forth above, and a presently disclosed solar cell comprises the electrode set forth above. A solar cell that includes the presently disclosed electrode has high conversion efficiency.

Moreover, the present disclosure aims to advantageously solve the problems set forth above, and a presently disclosed method of producing a conductive film comprises: a step (1) of applying any one of the dispersion liquids set forth above onto a base material and drying the dispersion liquid to form a conductive film; and a step (2) of washing the conductive film obtained in step (1) with a solvent to at least partially remove the condensate (B) from the conductive film. The presently disclosed method of producing a conductive film enables efficient production of a conductive film having excellent close adherence with a base material.

Advantageous Effect

According to the present disclosure, it is possible to provide a dispersion liquid that can improve coatability (wettability) with respect to a base material and can form a conductive film having high close adherence with a base material.

Moreover, according to the present disclosure, it is possible to provide a conductive film that has high close adherence with a base material and a production method thereof, an electrode that includes this conductive film and has high electrical conductivity, and a solar cell that includes this electrode and has high conversion efficiency.

BRIEF DESCRIPTION OF THE DRAWING

In the accompanying drawing,
FIG. 1 is a cross-sectional view illustrating the structure of one example of a solar cell module.

DETAILED DESCRIPTION (Dispersion Liquid)
The presently disclosed carbon material dispersion liquid contains a carbon material (A), a condensate (B), and a solvent (C), and may further contain any other components as necessary.

The presently disclosed dispersion liquid is preferably acidic. Through the dispersion liquid being acidic, a conductive layer formed on a substrate is eroded in a situation in which the dispersion liquid is applied onto the conductive layer formed on the substrate, which can improve close adherence of the conductive layer formed on the substrate and a conductive layer formed through the dispersion liquid.
<Carbon Material (A)>
The carbon material (A) is not specifically limited and can be a carbon material having electrical conductivity such as fibrous carbon nanostructures, graphene, fullerenes, carbon nanohorns, graphite, activated carbon, carbon fiber, porous carbon, expanded graphite, or carbon particles (for example, carbon black such as Ketjenblack or acetylene black). One of these types of carbon materials may be used individually, or two or more of these types of carbon materials may be used in combination.

Of these carbon materials, fibrous carbon nanostructures are preferable in terms of an obtained conductive film having excellent strength and catalytic performance.
<<Fibrous Carbon Nanostructures>>
Specific examples of fibrous carbon nanostructures that can be used include structures in which conical structures are stacked, such as cup-stacked carbon nanotubes, circular tube-shaped carbon nanostructures such as carbon nanobuds and carbon nanotubes (CNTs), and non-circular tube-shaped carbon nanostructures such as graphene nanoribbons in which a six-membered ring network of carbon is formed in a flattened tube shape. One of these types of fibrous carbon nanostructures may be used individually, or two or more of these types of fibrous carbon nanostructures may be used in combination.

Of the examples given above, fibrous carbon nanostructures including CNTs are more preferably used as fibrous carbon nanostructures. Note that the fibrous carbon nanostructures may be composed of only CNTs. When fibrous carbon nanostructures including CNTs are used, it is possible to efficiently impart characteristics to an obtained conductive film, such as electrical conductivity, film strength, and also catalytic activity in a case in which the conductive film is used in an electrode for a solar cell, even using a small amount of the fibrous carbon nanostructures.

The CNTs among the fibrous carbon nanostructures can be single-walled carbon nanotubes and/or multi-walled carbon nanotubes without any specific limitations. The CNTs are preferably carbon nanotubes having from 1 to 5 walls, and are more preferably single-walled carbon nanotubes. One of these types of carbon nanotubes may be used individually, or two or more of these types of carbon nanotubes may be used in combination. When the carbon nanotubes have fewer walls, the carbon nanotubes have a larger specific surface area and can impart characteristics well to an obtained conductive film, such as catalytic activity in a case in which the conductive film is used in an electrode for a solar cell, even when a small amount of the carbon nanotubes is used.

The average diameter of the fibrous carbon nanostructures is preferably 1 nm or more, and is preferably 60 nm or less, more preferably 30 nm or less, and particularly preferably 10 nm or less. When the average diameter of the fibrous carbon nanostructures is 1 nm or more, dispersibility of the fibrous carbon nanostructures can be increased, and characteristics such as electrical conductivity can be imparted well to a conductive film in a stable manner. Moreover, when the average diameter of the fibrous carbon nanostructures is 60 nm or less, characteristics can be efficiently imparted to an obtained conductive film, such as catalytic activity in a case in which the conductive film is used in an electrode for a solar cell, even when a small amount of the fibrous carbon nanostructures is used.

Note that the "average diameter of fibrous carbon nanostructures" referred to in the present disclosure can be determined by measuring the diameters (external diameters) of 20 of the fibrous carbon nanostructures, for example, in a transmission electron microscope (TEM) image, and then calculating a number-average value of the measured diameters.

The fibrous carbon nanostructures are preferably fibrous carbon nanostructures for which a ratio ($3\sigma/Av$) of a value ($3\sigma$) obtained by multiplying the diameter standard deviation ($\sigma$: sample standard deviation) by 3 relative to the average diameter (Av) is more than 0.20 and less than 0.60, more preferably fibrous carbon nanostructures for which $3\sigma/Av$ is more than 0.25, and particularly preferably fibrous carbon nanostructures for which $3\sigma/Av$ is more than 0.40. By using fibrous carbon nanostructures for which $3\sigma/Av$ is more than 0.20 and less than 0.60, the performance of a produced conductive film can be further improved.

The average diameter (Av) and the standard deviation ($\sigma$) of the fibrous carbon nanostructures may be adjusted by changing the production method and the production conditions of the fibrous carbon nanostructures, or may be adjusted by combining a plurality of types of fibrous carbon nanostructures obtained by different production methods.

The fibrous carbon nanostructures that are typically used take a normal distribution when a plot is made of diameter measured as described above on a horizontal axis and probability density on a vertical axis, and a Gaussian approximation is made.

The average length of the fibrous carbon nanostructures is preferably 10 μm or more, more preferably 50 μm or more, and particularly preferably 80 μm or more, and is preferably 600 µm or less, more preferably 500 µm or less, and particularly preferably 400 µm or less. When the average length is 10 µm or more, conduction paths can be formed in a conductive film even using a small amount of the fibrous carbon nanostructures, and the conductive film has high strength. Moreover, when the average length is 600 µm or less, coatability of the dispersion liquid onto a base material during application can be improved. Therefore, setting the average length of the fibrous carbon nanostructures within any of the ranges set forth above makes it possible to sufficiently reduce the surface resistivity of a conductive film and impart high catalytic activity to the conductive film.

Note that the average length of "fibrous carbon nanostructures" referred to in the present disclosure can be determined by measuring the lengths of 20 of the fibrous carbon nanostructures, for example, in a scanning electron microscope (SEM) image, and then calculating a number-average value of the measured lengths.

The fibrous carbon nanostructures normally have an aspect ratio of more than 10. Note that the aspect ratio of fibrous carbon nanostructures can be determined by measuring the diameters and lengths of 100 randomly selected fibrous carbon nanostructures using a scanning electron microscope or a transmission electron microscope, and then calculating an average value of the ratio of diameter and length (length/diameter).

The BET specific surface area of the fibrous carbon nanostructures is preferably 200 $m^2/g$ or more, more preferably 400 $m^2/g$ or more, and particularly preferably 600 $m^2/g$ or more, and is preferably 2,000 $m^2/g$ or less, more preferably 1,800 $m^2/g$ or less, and particularly preferably 1,600 $m^2/g$ or less. When the BET specific surface area of the fibrous carbon nanostructures is 200 $m^2/g$ or more, dispersibility of the fibrous carbon nanostructures can be increased, and characteristics can be imparted well to an obtained conductive film, such as electrical conductivity and also catalytic activity in a case in which the conductive film is used in an electrode for a solar cell, even when a small amount of the fibrous carbon nanostructures is used. Moreover, when the BET specific surface area of the fibrous carbon nanostructures is 2,000 $m^2/g$ or less, characteristics can be imparted well to an obtained conductive film, such as electrical conductivity and also catalytic activity in a case in which the conductive film is used in an electrode for a solar cell, and coatability of the dispersion liquid can be stabilized.

The term "BET specific surface area" as used in the present disclosure refers to nitrogen adsorption specific surface area measured by the BET method.

A t-plot for the fibrous carbon nanostructures obtained from an adsorption isotherm preferably exhibits a convex upward shape. Note that a "t-plot" can be obtained by, in an adsorption isotherm of the fibrous carbon nanostructures measured by the nitrogen gas adsorption method, converting the relative pressure to an average thickness t (nm) of an adsorbed layer of nitrogen gas. Specifically, an average adsorbed nitrogen gas layer thickness t corresponding to a given relative pressure is calculated from a known standard isotherm of average adsorbed nitrogen gas layer thickness t plotted against relative pressure P/P0 and the relative pressure is converted to the corresponding average adsorbed nitrogen gas layer thickness t to obtain a t-plot for the fibrous carbon nanostructures (t-plot method of de Boer et al.).

In a substance having pores at its surface, the growth of the adsorbed layer of nitrogen gas is categorized into the following processes (1) to (3). The gradient of the t-plot changes in accordance with processes (1) to (3).

(1) A process in which a single molecule adsorption layer of nitrogen molecules is formed over the entire surface (2) A process in which a multi-molecule adsorption layer is formed and is accompanied by capillary condensation filling of pores (3) A process in which a multi-molecule adsorption layer is formed at a surface that appears to be non-porous due to the pores being filled by nitrogen In a t-plot having a convex upward shape, the plot is on a straight line passing through the origin in a region in which the average adsorbed nitrogen gas layer thickness t is small, but, as t increases, the plot deviates downward from the straight line. When fibrous carbon nanostructures have a t-plot shape such as described above, this indicates that the fibrous carbon nanostructures have a large ratio of internal specific surface area relative to total specific surface area and that many openings are present in carbon nanostructures constituting the fibrous carbon nanostructures.

A bending point of the t-plot for the fibrous carbon nanostructures is preferably within a range satisfying $0.2 \leq t$ (nm)$\leq 1.5$, more preferably within a range satisfying $0.45 \leq t$ (nm)$\leq 1.5$, and particularly preferably within a range satisfying $0.55 \leq t$ (nm)$\leq 1.0$. When the bending point of the t-plot for the fibrous carbon nanostructures is within any of the ranges set forth above, dispersibility of the fibrous carbon nanostructures can be increased, and characteristics such as electrical conductivity of a conductive film can be enhanced using a small amount of the fibrous carbon nanostructures. More specifically, the fibrous carbon nanostructures aggregate more easily and have lower dispersibility when the value of the bending point is less than 0.2, whereas the fibrous carbon nanostructures become entangled with one another more easily and have lower dispersibility when the value of the bending point is more than 1.5.

The "position of the bending point" is defined as an intersection point of a linear approximation A for the above-described process (1) and a linear approximation B for the above-described process (3).

A ratio (S2/S1) of the internal specific surface area S2 of the fibrous carbon nanostructures relative to the total specific surface area S1 of the fibrous carbon nanostructures obtained from the t-plot is preferably not less than 0.05 and not more than 0.30. When the value of S2/S1 for the fibrous carbon nanostructures is within the range set forth above, dispersibility of the fibrous carbon nanostructures can be increased, and characteristics such as electrical conductivity of a conductive film can be enhanced using a small amount of the fibrous carbon nanostructures.

The total specific surface area S1 and the internal specific surface area S2 of the fibrous carbon nanostructures can be determined from the t-plot for the fibrous carbon nanostructures. Specifically, the total specific surface area 51 and external specific surface area S3 can first be determined from the gradient of the linear approximation of process (1) and the gradient of the linear approximation of process (3), respectively. The internal specific surface area S2 can then be calculated by subtracting the external specific surface area S3 from the total specific surface area S1.

Measurement of an adsorption isotherm of the fibrous carbon nanostructures, preparation of a t-plot, and calculation of the total specific surface area S1 and the internal specific surface area S2 based on t-plot analysis can be performed using a BELSORP®-mini (BELSORP is a registered trademark in Japan, other countries, or both), for example, which is a commercially available measurement apparatus produced by Bel Japan Inc.

The fibrous carbon nanostructures including CNTs that can suitably be used as the fibrous carbon nanostructures preferably have a radial breathing mode (RBM) when evaluated by Raman spectroscopy. Note that an RBM is not present in the Raman spectrum of fibrous carbon nanostructures composed of only multi-walled carbon nanotubes having three or more walls.

A ratio (G/D ratio) of G-band peak intensity relative to D-band peak intensity in a Raman spectrum for the fibrous carbon nanostructures including CNTs is preferably not less than 0.5 and not more than 10.0, and more preferably not less than 1.0 and not more than 5.0. When the G/D ratio is not less than 0.5 and not more than 10.0, characteristics can be imparted well to an obtained conductive film, such as catalytic activity in a case in which the conductive film is used in an electrode for a solar cell.

In the fibrous carbon nanostructures including CNTs, the oxygen atom content relative to the total of carbon atoms and oxygen atoms according to elemental analysis by XPS is preferably 5 atom % or less, more preferably 2 atom % or less, and particularly preferably 1 atom % or less. When the oxygen atom content is within any of the preferable ranges set forth above, characteristics can be imparted well to an obtained conductive film, such as catalytic activity in a case in which the conductive film is used in an electrode for a solar cell.

The proportion constituted by carbon atoms in the fibrous carbon nanostructures including CNTs according to CHN elemental analysis is preferably 85 mass % or more, more preferably 90 mass % or more, even more preferably 95 mass % or more, and particularly preferably 98 mass % or more. Moreover, the proportion constituted by hydrogen atoms in the fibrous carbon nanostructures including CNTs according to CHN elemental analysis is preferably 1 mass % or less, more preferably 0.8 mass % or less, more preferably 0.3 mass % or less, and particularly preferably 0.1 mass % or less.

When the proportion constituted by carbon atoms (hydrogen atoms) is within any of the preferable ranges set forth above, characteristics can be imparted well to an obtained conductive film, such as catalytic activity in a case in which the conductive film is used in an electrode for a solar cell.

Note that the fibrous carbon nanostructures including CNTs can be produced by a known CNT synthesis method such as arc discharge, laser ablation, or chemical vapor deposition (CVD) without any specific limitations. Specifically, the fibrous carbon nanostructures including CNTs can be efficiently produced, for example, in accordance with a method in which during synthesis of CNTs through chemical vapor deposition (CVD) by supplying a feedstock compound and a carrier gas to a base material having a catalyst layer for carbon nanotube production at the surface thereof, catalytic activity of the catalyst layer is dramatically improved through the presence of a trace amount of an oxidant (catalyst activating material) in the system (super growth method; refer to WO2006/011655A1). Hereinafter, carbon nanotubes that are obtained by the super growth method are also referred to as "SGCNTs".

Fibrous carbon nanostructures produced by the super growth method may be composed of only SGCNTs or may include other carbon nanostructures such as non-circular tube-shaped carbon nanostructures, for example, in addition to SGCNTs.

Although no specific limitations are placed on the content of the carbon material (A) in the dispersion liquid, the content of the carbon material (A) in the overall dispersion liquid is preferably 0.001 mass % or more, more preferably 0.01 mass % or more, and particularly preferably 0.1 mass % or more, and is preferably 30.0 mass % or less, more preferably 10.0 mass % or less, even more preferably 5.0 mass % or less, and particularly preferably 1.0 mass % or less.

<Condensate (B)>

The condensate (B) is a condensate of an aromatic sulfonic acid compound, a hydroxyphenol compound, and an aldehyde compound and functions as a dispersant for the carbon material (A).

The condensate (B) has excellent dispersibility of the carbon material (A) (for example, CNTs) and is easily removed through solvent washing, which makes it possible to obtain a conductive film having improved catalytic activity, high close adherence, and high strength of the film itself, and also to obtain a good electrode, such as a counter electrode.

<<Aromatic Sulfonic Acid Compound>>

The term "aromatic sulfonic acid compound" refers to a "compound in which any one of the hydrogen atoms of an aromatic compound has been replaced by —$SO_3X$ (X is a hydrogen atom or a cation)".

Examples of aromatic sulfonic acid compounds that can be used include phenolsulfonic acids (PSA) such as p-phenolsulfonic acid, o-phenolsulfonic acid, and phenoldisulfonic acid; naphtholsulfonic acids such as 1-naphthol-4-sulfonic acid, 2-naphthol-6-sulfonic acid, 2-naphthol-7-sulfonic acid, 1-naphthol-6-sulfonic acid, and 2-naphthol-8-sulfonic acid; naphthalenesulfonic acids such as 4-aminonaphthalenesulfonic acid; and sulfanilic acid (4-aminobenzenesulfonic acid). One of these aromatic sulfonic acid compounds may be used individually, or two or more of these aromatic sulfonic acid compounds may be used in combination in a freely selected ratio.

Of these aromatic sulfonic acid compounds, phenolsulfonic acids (PSA) and 4-aminobenzenesulfonic acid are preferable in terms of condensation reactivity and solubility of the produced condensate in a solvent.

<<Hydroxyphenol Compound>>

The term "hydroxyphenol compound" refers to a "compound including at least one hydroxy group" that is a compound other than an "aromatic sulfonic acid compound".

Examples of hydroxyphenol compounds that can be used include hydroxyphenols such as bisphenol A, 4,4-biphenol, 3,3,5,5-tetramethyl-4,4-biphenol, and bis(4-hydroxy-3,5-dimethylphenyl)methane; compounds having a naphthalene skeleton such as 2,7-dihydroxynaphthalene, 1,6-dihydroxynaphthalene, and 1,1-bis(2-naphthol); hydroxydiphenylsulfones S) such as 4,4'-dihydroxydiphenylsulfone, 2,4'-dihydroxydiphenylsulfone, and bis(4-hydroxy-3,5-dimethylphenyl)sulfone; and polyfunctional phenols such as 1,1,1-tris(4-hydroxyphenyl)methane and 1,1,2,2-tetrakis(4-hydroxyphenyl)ethane. One of these hydroxyphenol compounds may be used individually, or two or more of these hydroxyphenol compounds may be used in combination in a freely selected ratio.

Of these hydroxyphenol compounds, compounds such as dihydroxydiphenylsulfones that include not fewer than two and not more than four hydroxy groups, that include not fewer than one and not more than three six-membered rings, and that include a linking group such as a sulfonyl group are preferable in terms of ease of production, adhesiveness with a base material, and solubility of the produced condensate in a solvent.

<<Aldehyde Compound>>

Examples of aldehyde compounds that can be used include aliphatic aldehydes such as formaldehyde, acetaldehyde, propionaldehyde, n-butyraldehyde, isobutyraldehyde, and glyoxal; and aldehydes having a cyclic structure such as furfural, benzaldehyde, salicyl aldehyde, and paraformaldehyde.

An aqueous solution may be used as the aldehyde compound.

The aldehyde compound is preferably used in an amount of approximately not less than 0.5 molar equivalents and not more than 2 molar equivalents relative to the total used amount of the aromatic sulfonic acid compound and the hydroxyphenol compound, and is more preferably used in an amount of approximately not less than 1.0 molar equivalents and not more than 1.9 molar equivalents relative to the total used amount of the aromatic sulfonic acid compound and the hydroxyphenol compound. The presence of a large amount of unreacted aromatic sulfonic acid compound and hydroxyphenol compound at the end of the reaction can be inhibited when the used amount of the aldehyde compound is not less than any of the lower limits set forth above, and the presence of a large amount of free aldehyde compound in the condensate solution can be inhibited when the used amount of the aldehyde compound is not more than any of the upper limits set forth above.

A condensation reaction of the aromatic sulfonic acid compound, the hydroxyphenol compound, and the aldehyde compound is performed by a commonly known method.

For example, a condensation reaction of the aromatic sulfonic acid compound, the hydroxyphenol compound, and the aldehyde compound may be carried out in the presence of an acid catalyst or an alkali catalyst to produce an aldehyde condensate (condensate (B)).

Water, an alcohol, or the like is used as a solvent in the condensation reaction of the aromatic sulfonic acid compound, the hydroxyphenol compound, and the aldehyde compound.

Examples of acid catalysts that can be used include hydrochloric acid, sulfuric acid, oxalic acid, acetic acid, and toluenesulfonic acid. One of these acid catalysts may be used individually, or two or more of these acid catalysts may be used in combination in a freely selected ratio.

Examples of alkali catalysts that can be used include alkali metal hydroxides such as sodium hydroxide and potassium hydroxide; alkaline earth metal hydroxides such as calcium hydroxide and barium hydroxide; and amines such as ammonia and triethylamine. One of these alkali catalysts may be used individually, or two or more of these alkali catalysts may be used in combination in a freely selected ratio. Of these alkali catalysts, sodium hydroxide is preferable in terms of convenience of operation.

An acid catalyst may be selected in a case in which a novolac structure is to be produced as the structure of the condensate (B) described below, and an alkali catalyst may be selected in a case in which a resol structure is to be produced as the structure of the condensate (B).

Note that in a case in which the condensation reaction of the aromatic sulfonic acid compound, the hydroxyphenol compound, and the aldehyde compound is carried out in the presence of an alkali catalyst, an amount of alkali necessary for neutralizing strongly acidic components present in the reaction system is used. Examples of strongly acidic components that may be present in the reaction system include free sulfuric acid and sulfo groups that are bonded to phenols.

The reaction temperature and the reaction time in production of the condensate (B) are not specifically limited, and a reaction temperature and a reaction time such that production of a condensate (B) having a desired weight-average molecular weight (standard polyethylene glycol-equivalent value) is easy to control may be selected as appropriate.

The reaction temperature is preferably 60° C. or higher, and is preferably 120° C. or lower, but is not specifically limited thereto.

The reaction time is preferably 3 hours or more, and is preferably 20 hours or less, but is not specifically limited thereto.

The obtained formaldehyde condensate may be isolated after the condensation reaction, or the reaction product may be used in that form.

The structure of the condensate (B) may be a novolac type (thermoplastic type) such as a random novolac or high ortho novolac, or may be a resol type (thermosetting type) such a benzyl ether resol, an ammonia resol, or an alkali resol. From a viewpoint of close adherence of the carbon material (A) (for example, CNTs) and a base material after application and drying of the dispersion liquid, the structure of the condensate (B) is preferably a resol type, and is more preferably represented by general formula (1) or general formula (2), shown below.

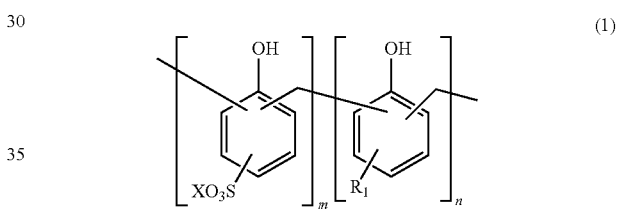

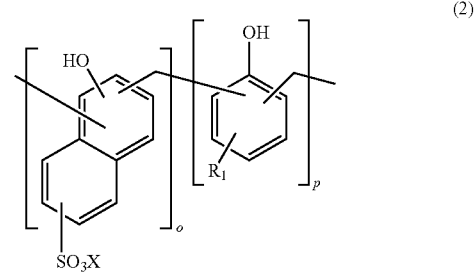

(In general formula (1) and general formula (2), X is a hydrogen atom or a cation, $R_1$ is a hydroxy group, —$CH_2$—OH, or a group represented by general formula (3), shown below, and m, n, o, and p are each an integer of 1 or more, with integers satisfying $1 \leq m \leq 235$, $1 \leq n \leq 206$, $1 \leq o \leq 192$, and $1 \leq p \leq 206$ being preferable.)

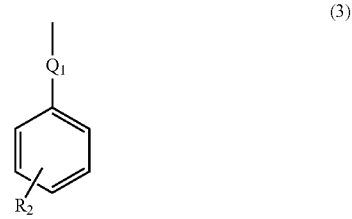

(In general formula (3), 1 is an integer of 0 to 4, Q is a divalent organic group (for example, —$CH_2$—, —$C(CH_3)_2$—, —S—, —$SO_2$- (sulfonyl group), —NH—, or —N=N—), preferably —S— or —$SO_2$- (sulfonyl group), and more preferably —$SO_2$- (sulfonyl group), and $R_2$ is a hydroxy group, —$CH_2$—OH, or a hydrogen atom.)

Note that examples of cations that may be represented by X in general formula (1) include a lithium ion, a sodium ion, a potassium ion, a calcium ion, a magnesium ion, and an ammonium ion.

A molar ratio of hydroxyphenol compound monomer units derived from the hydroxyphenol compound relative to aromatic sulfonic acid compound monomer units derived from the aromatic sulfonic acid compound (hydroxyphenol compound monomer units/aromatic sulfonic acid compound monomer units) in the condensate (B) is preferably 1/9 or more, more preferably 1/5 or more, even more preferably 1/4 or more, and particularly preferably 1/3 or more, and is preferably 9/1 or less, more preferably 5/1 or less, even more preferably 4/1 or less, and particularly preferably 3/1 or less.

Solubility of the condensate (B) in the solvent (C) can be improved and a conductive film having high close adherence to a base material can be formed when this ratio is not less than any of the lower limits set forth above, whereas dispersibility of the carbon material (A) can be improved when this ratio is not more than any of the upper limits set forth above.

The weight-average molecular weight (standard polyethylene glycol-equivalent value) of the condensate (B) is preferably 500 or more, more preferably 1,000 or more, even more preferably 2,000 or more, and particularly preferably 5,000 or more, and is preferably 100,000 or less, more preferably 50,000 or less, and particularly preferably 30,000 or less.

An obtained conductive film can be provided with sufficient close adherence with a base material and film strength when the weight-average molecular weight (standard polyethylene glycol-equivalent value) of the condensate (B) is not less than any of the lower limits set forth above, whereas dispersibility of the carbon material, rinsability of an obtained conductive film, and electrode performance of an obtained electrode are excellent when the weight-average molecular weight (standard polyethylene glycol-equivalent value) of the condensate (B) is not more than any of the upper limits set forth above.

The content of the condensate (B) per 100 parts by mass of the carbon material (A) is preferably 50 parts by mass or more, more preferably 80 parts by mass or more, and particularly preferably 130 parts by mass or more, and is preferably 500 parts by mass or less, more preferably 350 parts by mass or less, and particularly preferably 250 parts by mass or less.

An obtained conductive film can be provided with sufficient close adherence with a base material and film strength when the content of the condensate (B) is not less than any of the lower limits set forth above, whereas dispersibility of the carbon material, rinsability, and electrode performance of an obtained electrode are excellent when the content of the condensate (B) is not more than any of the upper limits set forth above.

<Solvent (C)>

The solvent (C) may be an aqueous solvent or an organic solvent, but is preferably an aqueous solvent (i.e., the solvent (C) preferably includes water). Water may be used by itself as the aqueous solvent, or a mixed solvent of water and a solvent that is miscible therewith may be used as the aqueous solvent without any specific limitations so long as the carbon material (A) (for example, CNTs) can be dispersed therein. The solvent that is miscible with water may be an ether (dioxane, tetrahydrofuran, methyl cellosolve, ethylene glycol dimethyl ether, ethylene glycol butyl ether, etc.), an ether alcohol (ethoxyethanol, methoxyethanol, etc.), an ester (methyl acetate, ethyl acetate, etc.), a ketone (acetone, methyl isobutyl ketone, cyclohexanone, methyl ethyl ketone, etc.), an alcohol (methanol, ethanol, isopropanol, propylene glycol, ethylene glycol, diacetone alcohol, phenol, etc.), a lower carboxylic acid (acetic acid, etc.), an amine (triethylamine, trimethanolamine, etc.), a nitrogen-containing polar solvent (N,N-dimethylformamide, nitromethane, N-methylpyrrolidone, acetonitrile, etc.), a sulfur compound (dimethyl sulfoxide, etc.), or the like. One of these solvents may be used individually, or two or more of these solvents may be used in combination in a freely selected ratio.

Of these solvents, ethers, ketones, and alcohols are preferable as the solvent that is miscible with water from a viewpoint of improving stability of the dispersion liquid.

These solvents may be subjected to degassing or the like at an appropriate timing.

Although no specific limitations are placed on the pH of the dispersion liquid in a case in which the solvent (C) of the dispersion liquid includes water, the pH of the dispersion liquid is preferably 0.1 or higher, more preferably 0.2 or higher, and particularly preferably 0.5 or higher, and is preferably lower than 7 (i.e., acidic), more preferably 6 or lower, even more preferably 5 or lower, further preferably 4 or lower, and particularly preferably 2.5 or lower. When the pH of the dispersion liquid is within any of the ranges set forth above, stability of the dispersion liquid can be ensured.

Note that the pH of the dispersion liquid can be lowered through addition of an acidic substance. The acidic substance is preferably sulfuric acid, hydrochloric acid, nitric acid, citric acid, oxalic acid, tartaric acid, formic acid, phosphoric acid, or the like, for example, and is more preferably hydrochloric acid or nitric acid from a viewpoint of ease of removal by rinsing.

<Other Components>

Examples of other components that can be used include inorganic materials such as silica, metal particles, binders, conductive additives, surfactants, defoamers, antioxidants, and preservatives. Commonly known components may be used as appropriate as such components. One of these other components may be used individually, or two or more of these other components may be used in combination in a freely selected ratio.

<Production Method of Dispersion Liquid>

No specific limitations are placed on the method by which the dispersion liquid is produced. For example, a condensate (B)-containing solution obtained by dissolving the condensate (B) that functions as a dispersant in a solvent may be added to a mixture of the carbon material (A) and the solvent (C), or the carbon material (A) may be added to a mixture of the condensate (B) and the solvent (C). Also note that a condensate (B)-containing alkali solution obtained by dissolving the condensate (B) that functions as a dispersant in a good solvent (for example, an alkali aqueous solution) may be added to a mixture of the carbon material (A) and the solvent (C) (for example, an acidic aqueous solution).

Mixing treatment or dispersing treatment of the dispersion liquid can be performed using a commonly known method. For example, a method using a wet jet mill such as a nanomizer or an ultimizer, a high-pressure homogenizer, an ultrasonic disperser, a ball mill, a sand grinder, a dyno-mill, a spike mill, a DCP mill, a basket mill, a paint conditioner, a high-speed stirring device such as a homo mixer, or the like may be adopted. One of these may be used individually, or two or more of these may be used in combination.

Production efficiency of the dispersion liquid is improved by using a high-pressure homogenizer, an ultrasonic disperser, a ball mill, a sand grinder, a dyno-mill, a spike mill, a DCP mill, a basket mill, a paint conditioner, a high-speed stirring device such as a homo mixer, or the like for preliminary dispersing and using a wet jet mill such as a nanomizer or an ultimizer, a high-pressure homogenizer, or the like for main dispersing.

The temperature during dispersing is not specifically limited but is normally not higher than the boiling point of the solvent, preferably 60° C. or lower, and more preferably 40° C. or lower, and is preferably −10° C. or higher, and more preferably 0° C. or higher. When the temperature is within any of the ranges set forth above, the solubility/structure of the dispersant can be controlled, dispersibility of the carbon material (A) can be improved, and alteration of the carbon material (A) can be inhibited even in a case in which treatment is performed in an acidic solution, for example.

(Conductive Film)

The presently disclosed conductive film is formed using the dispersion liquid set forth above. The presently disclosed conductive film has excellent electrical conductivity and mechanical characteristics as a result of containing the carbon material (A) in a well dispersed state. This conductive film has excellent close adherence (adhesiveness) with a base material and catalytic activity.

The presently disclosed conductive film can suitably be used, for example, as a conductive film of a photoelectrode substrate or counter electrode (catalyst electrode) substrate, or as a catalyst layer of a counter electrode (catalyst electrode) as described further below. In particular, the presently disclosed conductive film is suitable as a catalyst layer of a counter electrode (catalyst electrode).

(Production Method of Conductive Film)

A presently disclosed method of producing a conductive film includes a step (1) of applying the presently disclosed dispersion liquid onto a base material and drying the dispersion liquid to form a conductive film and a step (2) of washing the conductive film obtained in step (1) with a solvent to at least partially remove the condensate (B) from the conductive film, and may further include a step (3) of causing decomposition of some of the condensate (B) contained in the conductive film as necessary.

<Step (1)>

In step (1), the presently disclosed dispersion liquid is applied onto a base material and then the applied dispersion liquid is dried to form a conductive film.

<<Base Material>>

The base material can be selected as appropriate depending on the target application without any specific limitations on the shape, constituent material, and size (thickness, etc.) thereof so long as the dispersion liquid set forth above can be applied thereon and an obtained conductive film can be held thereon.

Note that the base material may be a base material on which a commonly known conductive film other than the presently disclosed conductive film has been formed, a base material that includes an undercoat layer of a resin or the like, or a base material that includes an organic/inorganic barrier layer displaying barrier properties against oxygen and/or moisture.

A commonly known application method can be adopted as the method by which the presently disclosed dispersion liquid is applied onto the base material.

Examples of application methods that can be used include dipping, roll coating, gravure coating, knife coating, air knife coating, roll knife coating, die coating, screen printing, spray coating, gravure offset, inkjet, and spray methods. Of these application methods, screen printing is preferable in terms of ease of forming an electrode pattern.

The application may be performed once or multiple times as necessary, and two different application methods may be combined.

Although no specific limitations are placed on the coating thickness (wet thickness) when the presently disclosed dispersion liquid is applied onto the base material so long as electrical conductivity of the obtained film is ensured, the coating thickness is preferably 0.001 μm or more, more preferably 0.005 μm or more, and particularly preferably 0.01 μm or more, and is preferably 50 μm or less, more preferably 10 μm or less, and particularly preferably 3 μm or less.

The applied amount of CNTs per unit area of the base material when the presently disclosed dispersion liquid is applied onto the base material is preferably 0.001 mg/m$^2$ or more, more preferably 0.005 mg/m$^2$ or more, and particularly preferably 0.01 mg/m$^2$ or more, and is preferably 50 g/m$^2$ or less, more preferably 10 g/m$^2$ or less, and particularly preferably 3 g/m$^2$ or less.

In formation of the presently disclosed conductive film, the thickness and the type (shape) of the used carbon material are normally reflected in that form in the conductive film that is formed. Accordingly, the thickness of the presently disclosed conductive film is normally 100 nm to 1 mm, but is not specifically limited thereto.

In a case in which the conductive film is used as a counter electrode of an organic solar cell such as a dye-sensitized solar cell, an organic thin-film solar cell, or a perovskite solar cell, for example, the thickness of the Conductive film is normally 0.01 μm to 100 μm, preferably 0.1 μm to 20 μm, and more preferably 0.5 μm to 10 μm. When the thickness of the conductive film is within any of the ranges set forth above, electrical conductivity and catalytic performance as an electrode are excellent, and the balance of overall series resistance, etc., when used in a module is excellent.

Through the thickness of the conductive film being within any of the ranges set forth above, even better electrical conductivity is obtained.

The presently disclosed conductive film has excellent electrical conductivity. The sheet resistance of the presently disclosed conductive film is normally 0.01 Ω/sq. to 1,000 Ω/sq., preferably 0.1 Ω/sq. to 100 Ω/sq., and more preferably 0.5 Ω/sq. to 20 Ω/sq.

The surface resistivity of the conductive film can be measured by a method in accordance with JIS K7194 using a low resistivity meter (for example, a Loresta®-GP MCP-T610 (product name; Loresta is a registered trademark in Japan, other countries, or both) produced by Mitsubishi Chemical Analytech Co., Ltd.).

A commonly known drying method can be adopted as the method by which the applied dispersion liquid is dried.

For example, the dispersion liquid on the base material can be dried to form a conductive film on the base material by air drying, heated drying such as hot-roll drying, drying under reduced pressure, infrared irradiation, light irradiation using a xenon lamp, a flash lamp, or the like, or electromagnetic wave heating using microwaves or the like. The drying temperature is not specifically limited so long as the solvent (C) can be removed by vaporization and the heat resistance temperature of the base material is not exceeded. The drying temperature is preferably 0° C. or higher, more preferably 15° C. or higher, even more preferably room temperature or higher, and particularly preferably 80° C. or higher, and is preferably 250° C. or lower, more preferably 200° C. or lower, and particularly preferably 150° C. or lower.

The drying time is not specifically limited but is preferably 0.1 minutes or more, and is preferably 150 minutes or less.

The drying atmosphere is not specifically limited and may be a humidified atmosphere, an air atmosphere, an inert gas atmosphere such as nitrogen or argon, or a reduced pressure atmosphere such as a vacuum.

In the presently disclosed method of producing a conductive film, the following step (2) is performed after step (1). Note that it is preferable that both step (2) and step (3) are performed from a viewpoint of more efficiently removing the condensate (B) (dispersant) from the conductive film.

<Step (2)>

In step (2), the conductive film obtained in step (1) is washed with a solvent to at least partially remove the condensate (B) (dispersant) from the conductive film.

This washing is performed with respect to the conductive film obtained through step (1), for example. In the washing, the conductive film and a solvent that can dissolve the condensate (B) are brought into contact, and the condensate (B) in the conductive film is caused to elute into the solvent so that some of the condensate (B) in the conductive film is removed from the conductive film.

Note that the solvent that can dissolve the condensate (B) is not specifically limited, and any of the same solvents as for the solvent (C) can be used. Of such solvents, water, alcohols, ketones, nitrogen-containing polar solvents, and the like are preferable from a viewpoint of ease of handling, for example, with an alkaline aqueous solution being more preferable.

Washing of the conductive film using a solvent that can dissolve the condensate (B) can be performed by immersing the conductive film in the solvent or by applying the solvent onto the conductive film, for example. Also note that washing of the conductive film may be split into a plurality of washes. The conductive film that has been washed can subsequently be dried by a known method.

In a case in which the condensate (B) is removed through immersion in the solvent, the immersion time is preferably 30 seconds or more, more preferably 1 minute or more, and particularly preferably 3 minutes or more, and is preferably 1 hour or less, and more preferably 30 minutes or less. This is because an immersion time of 30 seconds or more enables sufficient removal of the condensate (B). Moreover, an immersion time of 1 hour or less can prevent detachment of the carbon material from the conductive film and peeling of the conductive film from the base material caused by excessive washing.

<Step (3)>

In step (3), at least one treatment (hereinafter, also referred to as "decomposition treatment") selected from the group consisting of plasma treatment, UV treatment, and ozone treatment is performed with respect to at least the conductive film obtained in step (1) to cause decomposition of at least some of the condensate (B) contained in the conductive film.

In a case in which both step (2) and step (3) are performed, it is preferable that the decomposition treatment in step (3) is performed with respect to the conductive film that has undergone washing in step (2), although no specific limitations are placed on the order of these steps. In other words, in a case in which both step (2) and step (3) are performed, it is preferable that condensate (B) remaining in the conductive film after washing in step (2) is caused to decompose in step (3).

The decomposition treatment is performed with respect to the conductive film, for example. By performing at least one treatment selected from the group consisting of plasma treatment, UV treatment, and ozone treatment with respect to the conductive film in the decomposition treatment of the conductive film, at least some of the condensate (B) contained in the conductive film is caused to decompose. Note that a decomposition product produced in this decomposition treatment may optionally be removed using a technique such as washing after the decomposition treatment has been performed.

Also note that UV treatment is preferably used as the decomposition treatment from a viewpoint of ease of treatment.

In a situation in which the washing and/or decomposition treatment described above are performed, the amount of the condensate (B) (dispersant) in the conductive film decreases, and the proportional content of carbon in the conductive film improves. However, a layer form can be maintained well even when the condensate (B) (dispersant) is removed in a case in which long CNTs such as SGCNTs are used as the carbon material (A) because these CNTs are entangled with one another to form a reticulated structure.

Note that the washing and the decomposition treatment may be performed with respect to the conductive film after it has been formed on the base material or may be performed with respect to the conductive film after it has been peeled from the base material.

By performing the washing and/or decomposition treatment described above in the presently disclosed method of producing a conductive film, the proportional content of the condensate (B) (dispersant) contained in the conductive film decreases, and, conversely, the proportional content of carbon contained in the conductive film increases. Moreover, the removal of condensate (B) (dispersant) that is present at the surface of the conductive film leads to more carbon being exposed at the surface of the conductive film. This results in improvement of catalytic activity of the conductive film.

(Electrode)

The presently disclosed electrode is an electrode that is obtained using the presently disclosed conductive film. The presently disclosed electrode can suitably be used in an organic solar cell such as a dye-sensitized solar cell (DSC), an organic thin-film solar cell, or a perovskite solar cell, for example.

A DSC is used as an example for describing the presently disclosed electrode. A DSC normally has a structure in which a photoelectrode, an electrolyte layer, and a counter electrode are arranged in this order.

The photoelectrode is an electrode that can release electrons to an external circuit upon receiving light. The photoelectrode normally includes a photoelectrode substrate that has a conductive film formed on a base material, a porous semiconductor fine particulate layer that is formed on the photoelectrode substrate, and a sensitizing dye layer that is formed through adsorption of a sensitizing dye at the surface of the porous semiconductor fine particulate layer.

The electrolyte layer is a layer for separating the photoelectrode and the counter electrode and for performing efficient charge transfer.

The counter electrode is an electrode for efficiently passing electrons from the external circuit to the electrolyte layer. The counter electrode normally includes a counter electrode substrate that has a conductive film formed on a base material and a catalyst layer that is formed on the counter electrode substrate.

<Photoelectrode>

In the present disclosure, the photoelectrode normally includes a photoelectrode substrate that has the presently disclosed conductive film formed on a base material, a porous semiconductor fine particulate layer that is formed on the photoelectrode substrate, and a sensitizing dye layer that is formed through adsorption of a sensitizing dye at the surface of the porous semiconductor fine particulate layer.

<Base Material>

The base material can be selected as appropriate depending on the target application without any specific limitations on the shape, constituent material, and size (thickness, etc.) thereof so long as the presently disclosed dispersion liquid can be applied thereon and an obtained conductive film can be held thereon.

Examples of inorganic materials that can be used as the constituent material of the base material include glass and metals such as titanium, stainless steel, aluminum, iron, gold, and silver. Examples of organic materials that can be used include carbon materials and plastic substrate materials. A plastic substrate material is preferable from a viewpoint of improving close adherence (adhesiveness) with the conductive film and also improving conductive film stretching followability and flexibility. The plastic substrate material is preferably a low cost material having high heat resistance and excellent chemical resistance and gas barrier properties. The plastic substrate material may be a colorless and transparent material. Specific examples of such plastic substrate materials include polyesters (polyethylene terephthalate (PET), polyethylene naphthalate (PEN), etc.), styrenes (syndiotactic polystyrene (SPS), etc.), polyphenylene sulfide (PPS), polycarbonate (PC), polyarylate (PAr), polysulfone (PSF), polyester sulfone (PES), polyetherimide (PEI), transparent polyimide (PI), cycloolefin copolymers (ARTON® (product name; ARTON is a registered trademark in Japan, other countries, or both), etc.), alicyclic polyolefins (Zeonor® (product name; Zeonor is a registered trademark in Japan, other countries, or both), etc.), polycarbonate, polyamide, polyurethane, polymethyl methacrylate, cellulose, triacetyl cellulose, aramids, polypropylene, polyethylene, polylactic acid, polyvinyl chloride, and alicyclic acrylic resins. Of these plastic substrate materials, polyethylene terephthalate (PET), polyethylene naphthalate (PEN), and alicyclic polyolefins are particularly preferable from a viewpoint of chemical stability and cost.

In a case in which a plastic substrate material is used as the base material, the preferable thickness of the base material can be of various ranges from medium thickness to extremely thin thickness without any specific limitations. In such a situation, the thickness of the base material is preferably 1 μm or more, more preferably 5 μm or more, and particularly preferably 20 μm or more, and is preferably 1,000 μm or less, more preferably 500 μm or less, and particularly preferably 250 μm or less.

Moreover, a base material on which a commonly known conductive film other than the presently disclosed conductive film has been formed or a base material that includes an undercoat layer of a resin or the like may be used as the base material.

The commonly known conductive film mentioned above may, for example, be formed of a metal such as platinum, gold, silver, copper, aluminum, indium, or titanium; a conductive metal oxide such as tin oxide or zinc oxide; a complex metal oxide such as indium-tin oxide (ITO), indium-zinc oxide (IZO), or fluorine-doped tin oxide (FTO); a carbon material such as carbon nanotubes, carbon nanobuds, graphene, fullerenes, or diamond-like carbon (DLC); or a combination of two or more of these materials. The thickness thereof is not specifically limited but is normally 0.001 μm or more, preferably 0.01 μm or more, and more preferably 0.1 μm or more, and is normally 100 μm or less, preferably 50 μm or less, more preferably 1 μm or less, and even more preferably 0.5 μm or less.

The base material may be subjected to surface hydrophilization treatment such as glow discharge treatment, corona discharge treatment, or UV ozone treatment at a surface where the presently disclosed dispersion liquid is applied or a surface where the subsequently described porous semiconductor fine particulate layer is formed.

Furthermore, the surface of the base material where the presently disclosed dispersion liquid is applied or the surface at the opposite side of the base material may be subjected to hard coating treatment to impart wear resistance, high surface hardness, solvent resistance, stain resistance, fingerprint resistance, antireflection properties or the like, or may have a UV cutting layer, an organic and/or inorganic oxygen/moisture barrier layer, an easy slip layer, an easy adhesion layer, or the like provided thereat.

In the present disclosure, the photoelectrode substrate of the photoelectrode may be (1) a photoelectrode substrate having a stacking order of base material/presently disclosed conductive film, (2) a photoelectrode substrate having a stacking order of base material/presently disclosed conductive film/commonly known conductive film, or (3) a photoelectrode substrate having a stacking order of base material/commonly known conductive film/presently disclosed conductive film without any specific limitations, but configuration (3) is preferable in terms of stable performance and simple production. In particular, a photoelectrode substrate having a stacking order of base material (for example, PEN)/commonly known conductive film (for example, ITO)/presently disclosed conductive film (for example, CNT film) is more preferable in terms of having excellent electrical conductivity and durability.

<<Porous Semiconductor Fine Particulate Layer>>

The following provides an illustrative description of the porous semiconductor fine particulate layer including the sensitizing dye layer.

The porous semiconductor fine particulate layer is a porous layer that contains semiconductor fine particles. As a result of the porous semiconductor fine particulate layer being a porous layer, the amount of sensitizing dye that is adsorbed increases, and a dye-sensitized solar cell having high conversion efficiency is more easily obtained.

Examples of semiconductor fine particles that can be used include particles of metal oxides such as titanium oxide, zinc oxide, and tin oxide. The semiconductor fine particles are preferably titanium oxide. A layer in which titanium oxide is adopted as the semiconductor fine particles is a titanium oxide layer.

The particle diameter of the semiconductor fine particles (average particle diameter of primary particles) is preferably 1 nm or more, and is normally 500 nm or less, preferably 150 nm or less, and more preferably 80 nm or less. One type of particles having a particle diameter of 1 nm to 100 nm may be used individually, or two or more types of particles having particle diameters of 1 nm to 100 nm may be used in combination. Moreover, particles that are larger than 100 nm or particles that are 500 nm or smaller may also be used in combination. The use of small particles having a particle diameter of 100 nm or less can increase the specific surface area of the porous semiconductor fine particulate layer, whereas the use of particles larger than 100 nm can provide the porous semiconductor fine particulate layer with scattering properties and enables efficient use of incident light by the solar cell.

The thickness of the porous semiconductor fine particulate layer is normally 0.01 µm or more, preferably 0.1 µm or more, and more preferably 5 µm or more, and is preferably 30 µm or less, and more preferably 10 µm or less. A thickness that is within any of the ranges set forth above enables efficient use of incident light in the DSC.

A commonly known method can be selected as appropriate as the formation method of the porous semiconductor fine particulate layer without any specific limitations. For example, the porous semiconductor fine particulate layer can be formed by a commonly known method such as a pressing method, a hydrothermal decomposition method, an electrophoretic deposition method, an aerosol deposition (AD) method, a transfer method, or a binder-free coating method.

The heating temperature in formation of the porous semiconductor fine particulate layer is normally not lower than 100° C. and not higher than 600° C., and is preferably 200° C. or lower, and more preferably 160° C. or lower in a case in which a plastic or the like is used in the substrate.

A buffer layer may be formed between the porous semiconductor fine particulate layer and a conductive layer of the base material. No specific limitations are placed on the composition or production method of the buffer layer. For example, a metal oxide of titanium, tin, niobium, or the like may be deposited by sputtering or CVD, or an alkoxy compound or chloride of a corresponding metal element may be applied onto the conductive layer to form the buffer layer. The thickness of the buffer layer is normally 0.001 nm to 1,000 nm, and preferably 0.01 nm to 10 nm. A thickness that is within any of the ranges set forth above can provide improvement in terms of reverse current reaction of electrons, close adherence of the porous semiconductor fine particulate layer with a conductive layer, reduction of series resistance of a module, and so forth.

<<Sensitizing Dye Layer>>

The sensitizing dye layer is a layer where a compound (sensitizing dye) that can be excited by light and pass electrons to the porous semiconductor fine particulate layer is adsorbed at the surface of the porous semiconductor fine particulate layer.

The sensitizing dye can be selected as appropriate from among commonly known sensitizing dyes for dye-sensitized solar cells without any specific limitations, and examples thereof include organic dyes such as cyanine dyes, merocyanine dyes, oxonol dyes, xanthene dyes, squarylium dyes, polymethine dyes, coumarin dyes, riboflavin dyes, and perylene dyes; and metal complex dyes such as phthalocyanine complexes and porphyrin complexes of metals such as iron, copper, and ruthenium. Representative examples of sensitizing dyes include N3, N719, N749, D102, D131, D150, N205, HRS-1, MK-2, SK-1, and CYC. An organic solvent (dye solvent) in which the dye is dissolved is preferably subjected to degassing, distillation purification, and drying in advance in order to remove moisture and gas present in the solvent. Solvents such as alcohols (methanol, ethanol, propanol, etc.), nitriles (acetonitrile, etc.), halogenated hydrocarbons, ethers, amides, esters, carbonic acid esters, ketones, hydrocarbons, aromatics, and nitromethane are preferable.

Moreover, a co-adsorbent such as a carboxylic acid having a steroid skeleton (cholic acid, deoxycholic acid, etc.) may be included. The dye, solvent, and co-adsorbent may each be one type thereof used individually or two or more types thereof used in combination.

A commonly known method can be selected as appropriate as the formation method of the sensitizing dye layer without any specific limitations. For example, the sensitizing dye layer can be formed by a commonly known method such as a method in which the porous semiconductor fine particulate layer is immersed in a sensitizing dye solution or a method in which a sensitizing dye solution is applied onto the porous semiconductor fine particulate layer. It is preferable that after impregnation or application, a substrate including the porous semiconductor layer, or the like, is washed with the previously described dye solvent, or the like, so as to wash excess dye or the like. After formation or washing of the sensitizing dye layer, drying may be performed by a commonly known method such as heating, leaving to air, or drying under reduced pressure.

<Counter Electrode>

In the present disclosure, the counter electrode normally includes a counter electrode substrate that has the presently disclosed conductive film formed on a base material and a catalyst layer that is formed on the counter electrode substrate.

In the present disclosure, the counter electrode substrate of the counter electrode may be (1) a counter electrode substrate having a stacking order of base material/presently disclosed conductive film, (2) a counter electrode substrate having a stacking order of base material/presently disclosed conductive film/commonly known conductive film, or (3) a counter electrode substrate having a stacking order of base material/commonly known conductive film/presently disclosed conductive film without any specific limitations, but configuration (3) is preferable in terms of stable performance and simple production. A conductive film may display catalytic activity depending on the material thereof. In a case in which a conductive film displays catalytic activity, the counter electrode substrates having the configurations (1) to (3) can each be used in that form as a counter electrode. For example, in a case in which the presently disclosed conductive film is a CNT film, the presently disclosed conductive film displays catalytic activity and also functions as a catalyst layer. In particular, a counter electrode having a stacking order of base material (for example, PEN)/commonly known conductive film (for example, ITO)/presently disclosed conductive film (for example, CNT film) is more preferable as such a counter electrode in terms of having excellent catalytic activity and durability.

Note that the base material and the commonly known conductive film may be the same as any of those described for the photoelectrode, and preferred configurations thereof are also the same.

<<Catalyst Layer>>

The catalyst layer functions as a catalyst when passing electrons from the counter electrode to the subsequently described electrolyte layer in the organic solar cell. The catalyst layer can be formed of the presently disclosed conductive film (CNT film) as previously described or can be a commonly known catalyst layer that is selected as appropriate. For example, the catalyst layer preferably contains a conductive polymer, a carbon material, precious metal particles, or both a carbon material and precious metal particles that display catalytic action.

[Conductive Polymer]

Examples of conductive polymers that may be used include polythiophenes such as poly(thiophene-2,5-diyl), poly(3-butylthiophene-2,5-diyl), poly(3-hexylthiophene-2,5-diyl), and poly(2,3-dihydrothieno-[3,4-b]-1,4-dioxine) (PEDOT); polyacetylene and derivatives thereof; polyaniline and derivatives thereof; polypyrrole and derivatives thereof; and polyphenylene vinylenes such as poly(p-xylene tetrahydrothiophenium chloride), poly[(2-methoxy-5-(2'-ethylhexyloxy))-1,4-phenylenevinylene], poly[(2-methoxy-5-(3',7'-dimethyloctyloxy)-1,4-phenylenevinylene)], and poly[2-(2',5'-bis(2"-ethylhexyloxy)phenyl)-1,4-phenylenevinylene].

[Precious Metal Particles]

Commonly known precious metal particles can be selected as appropriate as the precious metal particles without any specific limitations so long as they display catalytic action. Examples include metal platinum, metal palladium, and metal ruthenium used individually or as an alloy, and precious metal particles having a core-shell structure. The particle diameter of these precious metal particles is normally 0.01 nm to 50 nm, but is not specifically limited thereto.

A commonly known method can be selected as appropriate as the formation method of the catalyst layer without any specific limitations. For example, the catalyst layer can be formed by applying or spraying, onto a conductive film, a mixed liquid obtained by dissolving or dispersing a conductive polymer, a carbon material, precious metal particles, or both a carbon material and precious metal particles in an appropriate solvent, and then drying the solvent of the mixed liquid. In a case in which a carbon material and/or precious metal particles are used, the mixed liquid may further contain a binder. The binder is preferably a polymeric compound including a functional group such as a hydroxy group, a carboxyl group, a sulfonyl group, or a phosphate group, or a sodium salt or the like of any of these functional groups, in terms of dispersibility of the carbon material and close adherence with a base material.

The thickness of the catalyst layer is preferably 0.005 μm or more, and is preferably 100 μm or less. The thickness is more preferably 0.01 μm to 50 μm, even more preferably 0.1 μm to 10 μm, and particularly preferably 0.5 to 5 μm. When the thickness of the catalyst layer is within any of the ranges set forth above, this provides excellent film strength, close adherence, and catalytic performance of the catalyst layer, low series resistance as a solar cell module, and solar cell performance.

<Electrolyte Layer>

The electrolyte layer is a layer for separating the photoelectrode and the counter electrode and for performing efficient charge transfer. The electrolyte layer may be a solid, a liquid, or a semi-solid such as a gel without any specific limitations. The electrolyte layer normally contains a supporting electrolyte, a redox couple (i.e., a couple of chemical species that can be reversibly converted between in a redox reaction in the form of an oxidant and a reductant), a solvent, and so forth.

<<Supporting Electrolyte>>

The supporting electrolyte may, for example, be (i) a salt of an alkali metal (lithium iodide, sodium iodide, etc.), an alkaline earth metal, or the like; (ii) an ionic liquid containing a pyridinium salt or a cation such as an imidazolium ion, a compound having a quaternary nitrogen atom at a spiro atom, or a quaternary ammonium ion; or the like.

<<Redox Couple>>

The redox couple can be any commonly known redox couple that can reduce a sensitizing dye that has been oxidized. Examples of redox couples that can be used include iodine compound/iodine, bromine compound/bromine, zinc complexes, iron complexes, and cobalt complexes.

<<Solvent>>

The solvent can be any solvent that is commonly known as a solvent for forming an electrolyte layer. The solvent may, for example, be a highly polar solvent such as acetonitrile, methoxyacetonitrile, methoxypropionitrile, N,N-dimethylformamide, ethylmethylimidazolium bis(trifluoromethylsulfonyl)imide, propylene carbonate, glycol ether, or γ-butyrolactone, with an aprotic solvent being preferable in terms of reliability of a solar cell module.

A commonly known method can be selected as appropriate as the formation method of the electrolyte layer without any specific limitations. For example, the electrolyte layer can be formed by applying a solution (electrolyte solution) containing constituent components of the electrolyte layer onto the photoelectrode and/or the counter electrode at atmospheric pressure or reduced pressure, or by producing a cell that includes the photoelectrode and the counter electrode and then injecting the electrolyte solution into a gap between the photoelectrode and the counter electrode.

(Solar Cell)

The presently disclosed solar cell includes the presently disclosed electrode set forth above. The presently disclosed solar cell is not specifically limited so long as it includes the presently disclosed electrode. The presently disclosed solar cell may be an organic solar cell such as the dye-sensitized solar cell described above, an organic thin-film solar cell, or a perovskite solar cell. Examples of perovskite solar cells include those described in JP2014-049631A, JP2015-046583A, JP2016-009737A, and so forth, for example. Other examples besides these organic solar cells include crystalline silicon solar cells such as monocrystalline silicon solar cells, polycrystalline silicon solar cells, microcrystalline silicon solar cells, and multi-bonded silicon solar cells; amorphous silicon solar cells; compound solar cells such as GaAs solar cells, CIS solar cells, and CdTe solar cells; and the like that are categorized based on the type of semiconductor substrate.

Moreover, the presently disclosed solar cell is not limited to using sunlight as a light source and may, for example, use room lighting as a light source.

The presently disclosed solar cell has high conversion efficiency as a result of including the presently disclosed electrode. The presently disclosed solar cell is preferably used as a portable solar cell or an indoor solar cell in order to particularly exploit such characteristics thereof.

One or a plurality of the presently disclosed solar cell may be used to form a solar cell module. The solar cell shape is not specifically limited and may be a Z type, W type, parallel type, current collection array type, monolithic type, or the like. One or two or more of these solar cells may be combined in series or parallel connection to connect multiple solar cells. The connection method may be through a commonly known means that is selected as appropriate such as solder, a metal plate, a cable, a flat cable, a flexible base material, or a cable.

Lead-out electrodes for withdrawing current from the module can be provided in the solar cells or the module. The position, material, production method, and so forth of the lead-out electrodes are not specifically limited and may be implemented by commonly known methods. The material can be a metal such as aluminum, nickel, stainless steel, copper, gold, silver, or solder, a paste of carbon or the like, conductive tape, or the like. Lead-out electrodes can be produced as appropriate such that two, in total, are respectively connected to a negative electrode and a positive electrode of the solar cell module.

Moreover, an electrode may include current collection wiring for efficiently collecting electrons generated in the solar cells. The current collection wiring can be commonly known current collection wiring that is selected as appropriate without any specific limitations. The current collection wiring can be produced, for example, by sputtering, vapor deposition, or plating; or through application by an inkjet or screen printing method, for example, using a conductive paste that contains photocurable and/or heat curable silver, carbon, or the like. A protective seal for protecting the current collection wiring from the electrolyte can be used in the current collection wiring. The protective seal can be a heat and/or photocurable resin such as low-polarity acrylic resin, polyisobutylene, polyisoprene, polybutadiene, or epoxy resin, or a thermoplastic resin such as Himilan.

Moreover, electrically insulating spacer particles can be used for ensuring isolation between electrodes in the solar cell module, and conductive fine particles can be used for electrical connection between cells. These may be used in a sealing resin such as a heat and/or photocurable resin or a thermoplastic resin such as Himilan that seals an electrolyte and/or adheres between electrodes in the solar cell module.

One example of a DSC module is illustrated in FIG. 1 as an example of the solar cell module set forth above. The DSC module 100 is a DSC module that includes a connected body in which a plurality (four in the illustrated example) of cells that are partitioned by partitions 8 are connected in series and has a Z type integrated structure. The DSC module 100 has a structure in which a first substrate 3 including a first base material 1 and a plurality (four in the illustrated example) of photoelectrodes 2 (first electrodes) that are disposed on the first base material 1 with separation therebetween and a second substrate 7 including a second base material 5 and a plurality (four in the illustrated example) of counter electrodes 6 (second electrodes) that are disposed on the second base material 5 with separation therebetween are bonded in a state with partitions 8 interposed between the first substrate 3 and the second substrate 7 such that a photoelectrode 2 and a counter electrode 6 of each cell are in opposition via an electrolyte layer 4 (functional layer) (i.e., such that a cell is formed) and such that a photoelectrode 2 of one cell among adjacent cells is electrically connected to a counter electrode 6 of the other cell among the adjacent cells via a cell connector 9 that is formed of a conductive resin composition. Each of the cells in the DSC module 100 includes a photoelectrode 2, a counter electrode 6 in opposition to the photoelectrode 2, and an electrolyte layer 4 disposed between the photoelectrode 2 and the counter electrode 6. The DSC module 100 also includes a first lead-out electrode 12A that is connected to a photoelectrode conductive layer 21 of a photoelectrode 2 and a second lead-out electrode 12B that is connected to a counter electrode conductive layer 61 of a counter electrode 6.

EXAMPLES

The following provides a more specific description of the present disclosure based on examples. However, the present disclosure is not limited to the following examples. In the following description, "%" and "parts" used in expressing quantities are by mass, unless otherwise specified. Measurements and evaluations in the examples were performed by the following methods.

<(1) Dispersibility of Dispersion Liquid (CNT and/or KB Paste)>

First, a transparent conductive plastic film (thickness: 186 µm; conductive layer-side surface resistance: 15 Ω/sq.) having a conductive layer formed of indium-tin complex oxide (ITO) on a base material made of polyethylene naphthalate (PEN) was prepared.

Next, a CNT and/or KB paste (dispersion liquid) obtained in each example or comparative example was dispersed by a wet jet mill (producer: Yoshida Kikai Co., Ltd.; product name: NanoVater) and was then applied onto a surface of the transparent conductive plastic film at a side where the conductive layer had been formed using an applicator (producer: Matsuo Sangyo Co., Ltd.) under conditions of a gap of 30 µm so as to form a carbon nanostructure (CNT and/or KB) coating film. The state of the formed coating film was visually inspected, and dispersibility of the CNT and/or KB paste was evaluated in accordance with the following standard. The evaluation results are shown in Table 1.

<<Evaluation Standard>>

A: No aggregates present and no streaks present at coating surface

B: Aggregates present and/or streaks present at coating surface

C: Many aggregates present and coating film cannot be formed

<(2) Screen Printing Properties of Dispersion Liquid (CNT and/or KB Paste)>

First, a transparent conductive plastic film (thickness: 186 µm; conductive layer-side surface resistance: 15 Ω/sq.) having a conductive layer formed of indium-tin complex oxide (ITO) on a base material made of polyethylene naphthalate (PEN) was prepared.

Next, a CNT and/or KB paste (dispersion liquid) obtained in each example or comparative example was applied by screen printing onto a surface of the transparent conductive plastic film at the side where the conductive layer had been formed using a 100-mesh screen and was then dried at 125° C. in an air atmosphere inside an inert oven (produced by Yamato Scientific Co., Ltd.) for 15 minutes to form a coating film. An arbitrarily selected location of 1 cm² in the coating film that had been formed was visually inspected, and screen printing properties of the CNT paste were evaluated in accordance with the following standard. The evaluation results are shown in Table 1. Note that fewer pinholes in visual inspection of the coating film indicates that the CNT and/or KB paste has better screen printing properties.

<<Evaluation Standard>>

A: No pinholes formed

B: Pinholes having a diameter of 1 mm or less formed

C: Pinholes having a diameter of more than 1 mm formed

<(3) Base Material Close Adherence of Conductive Film>

First, a transparent conductive plastic film (thickness: 186 µm; conductive layer-side surface resistance: 15 Ω/sq.) having a conductive layer formed of indium-tin complex oxide (ITO) on a base material made of polyethylene naphthalate (PEN) was prepared.

Next, a CNT and/or KB paste (dispersion liquid) obtained in each example or comparative example was applied by screen printing onto a surface of the transparent conductive plastic film at the side where the conductive layer had been formed using a 100-mesh screen and was then dried at 125° C. in an air atmosphere inside an inert oven (produced by Yamato Scientific Co., Ltd.) for 15 minutes to form a coating film. Thereafter, a rinsing liquid of each example or comparative example was used to perform rinsing. With respect to the rinsed coating film, the occurrence of "surface blistering" and "coating surface peeling" was visually inspected at three arbitrarily selected locations (locations of 1 cm² each) in the formed coating film, and base material close adherence of a conductive film was evaluated by the following standard. The evaluation results are shown in Table 1.

<<Evaluation Standard>>

A: No "surface blistering" and "coating surface peeling" observed at the three locations B: No "surface blistering" and "coating surface peeling" observed at two of the three locations, and only one case of "surface blistering" or "coating surface peeling" observed at the one location where "surface blistering" or "coating surface peeling" is observed C: Cases other than A and B described above <(4) Energy Conversion Efficiency of Solar Cell>

A solar simulator (PEC-L11 produced by Peccell Technologies Inc.) in which an AM1.5G filter was attached to a 150 W xenon lamp light source was used as a light source. The light intensity was adjusted to 1 sun (AM1.5G, 100 mW/cm² [Class A of JIS C8912]). A produced solar cell was connected to a sourcemeter (Series 2400 SourceMeter produced by Keithley Instruments) and the following current/voltage characteristic was measured.

Output current was measured while changing bias voltage from 0 V to 0.8 V in 0.01 V units under 1 sun light-irradiation. The output current was measured for each voltage step by, after the voltage had been changed, integrating values from 0.05 seconds after the voltage change to 0.15 seconds after the voltage change. Measurement was also performed while changing the bias voltage in the reverse direction from 0.8 V to 0 V, and an average value of measurements for the forward direction and the reverse direction was taken to be the photoelectric current.

Measurement results of the current/voltage characteristic described above were used to calculate the energy conversion efficiency (%).

The energy conversion efficiency of the solar cell was evaluated in accordance with the following standard. The evaluation results are shown in Table 1.

<<Evaluation Standard>>

A: Conversion efficiency of 4.0% or more

B: Conversion efficiency of not less than 3.5% and less than 4.0%

C: Conversion efficiency of not less than 3.0% and less than 3.5%

D: Conversion efficiency of less than 3.0%

<(5) Measurement of Weight-Average Molecular Weight (Mw) and Molecular Weight Distribution (Mn/Mw) of Condensate (B) (Dispersant)>

The weight-average molecular weight (Mw) and the molecular weight distribution (Mn/Mw) of a condensate (B) (dispersant) were measured under the following conditions by gel permeation chromatography (GPC) (Alliance HPLC System produced by Nihon Waters K.K.). Note that the weight-average molecular weight (Mw) was calculated as a standard polyethylene glycol-equivalent value.

<Measurement Conditions>

Column: SHODEX GF1G-7B×1 and SHODEX GF310HQ (filler particle diameter: 5 μm; internal diameter (I.D.): 30 cm)×1, connected in series Eluent: LiCl aqueous solution (0.05 mol/L)/acetonitrile=40/60

Flow rate: 0.6 mL/min

Column temperature: 30° C.

Detector: Differential refractive index (RI)

Injection volume: 50 μL

<(6) Measurement of Copolymerization Ratio (Molar Ratio) of Condensate (B) (Dispersant)>

A copolymerization ratio was determined from a ratio of the intensities of signals characteristic of the various monomers in ¹H-NMR (producer: Bruker Japan K. K.; product name: AVANCE III (500 MHz)) performed with a sample concentration of 1%. $CDCl_3$ was used as a deuterated solvent.

<Preparation of Single-Walled Carbon Nanotubes (SGCNTs)>

Single-walled carbon nanotubes (SGCNTs) obtained by the super growth method in accordance with WO2006/011655A1 were synthesized to obtain the following single-walled carbon nanotubes.

Note that the length, diameter, and diameter distribution were determined as average values for 20 arbitrarily selected carbon nanotubes using a TEM, the specific surface area was determined as the BET specific surface area using nitrogen, and the G/D ratio was determined through a Raman spectrum.

Length: 500 μm

Diameter: 3.5 nm

Diameter distribution (3σ/Av): 0.57

Specific surface area: 880 m²/g

G/D ratio: 4.0

CH elemental analysis: C=99.9%, H=0.1%

<Preparation of Single-Walled Carbon Nanotubes (HiPco)>

Single-walled carbon nanotubes (producer: NanoIntegris Inc.; product name: HiPco® (HiPco is a registered trademark in Japan, other countries, or both)) were prepared.

<Preparation of Carbon Particles (KB)>

Ketjenblack (producer: Lion Specialty Chemicals Co., Ltd.; product name: EC600JD; primary particle diameter: 34 nm) was prepared as carbon particles.

Synthesis Example 1: Preparation of Condensate (B) (Dispersant A)

A reactor was charged with 125.1 g (0.50 mol) of 4,4'-dihydroxydiphenylsulfone (DSF) (A component: hydroxyphenol compound), 87.0 g (0.10 mol) of p-phenolsulfonic acid (FS) (B component: aromatic sulfonic acid compound), and 210.4 g of water (amount of water such that the solid content concentration was 50 mass % after dropwise addition of the subsequently described C component), and then 68.3 g (0.82 mol) of 48 mass % sodium hydroxide aqueous solution (C component) was added dropwise.

Next, 81.2 g (1.00 mol) of 37 mass % formaldehyde aqueous solution (D component) was added dropwise under a temperature condition of 80° C., and a reaction was carried out under reflux (98° C. to 100° C.) for 4 hours. Thereafter, 368.2 g of water (amount of water such that the concentration of charged monomers (A component+B component) was 25 mass %) was added before the reaction ended to obtain 970 g of an aqueous solution containing a dispersant A. The dispersant A had a weight-average molecular weight of 790 (standard polyethylene glycol-equivalent value) upon measurement by GPC (gel permeation chromatography) and had an A component (hydroxyphenol compound):B component (aromatic sulfonic acid compound) molar ratio of 1:1 upon measurement by ¹H-NMR.

Synthesis Example 2: Preparation of Condensate (B) (Dispersant B)

Operations were performed in the same way as in Synthesis Example 1 with the exception that a reaction was carried out for 8 hours instead of 4 hours in Synthesis Example 1.

The dispersant B had a weight-average molecular weight of 2,400 (standard polyethylene glycol-equivalent value) upon measurement by GPC (gel permeation chromatography) and had an A component (hydroxyphenol compound):B component (aromatic sulfonic acid compound) molar ratio of 1:1 upon measurement by $^1$H-NMR.

Synthesis Example 3: Preparation of Condensate (B) (Dispersant C)

Operations were performed in the same way as in Synthesis Example 1 with the exception that the charged amounts (molar ratios) were set as described below instead of as the previously described charged amounts (molar ratios) in Synthesis Example 1.

The dispersant C had a weight-average molecular weight of 1,130 (standard polyethylene glycol-equivalent value) upon measurement by GPC (gel permeation chromatography) and had an A component (hydroxyphenol compound):B component (aromatic sulfonic acid compound) molar ratio of 1:3 upon measurement by $^1$H-NMR.

<<Charged Amounts (Molar Ratios) in Synthesis Example 3>>

4,4'-Dihydroxydiphenylsulfone (A component):p-phenolsulfonic acid (B component)=1:3

4,4'-Dihydroxydiphenylsulfone (A component):48 mass % sodium hydroxide aqueous solution (C component)=1: 0.75

(4,4'-Dihydroxydiphenylsulfone (A component)+p-phenolsulfonic acid (B component)):(37 mass % formaldehyde aqueous solution (D component))=1:1.25

Synthesis Example 4: Preparation of Condensate (B) (Dispersant D)

Operations were performed in the same way as in Synthesis Example 1 with the exception that the charged amounts (molar ratios) were set as described below instead of as the previously described charged amounts (molar ratios) in Synthesis Example 1.

The dispersant D had a weight-average molecular weight of 870 (standard polyethylene glycol-equivalent value) upon measurement by GPC (gel permeation chromatography) and had an A component (hydroxyphenol compound):B component (aromatic sulfonic acid compound) molar ratio of 3:1 upon measurement by $^1$H-NMR.

<<Charged Amounts (Molar Ratios) in Synthesis Example 4>>

4,4'-Dihydroxydiphenylsulfone (A component):p-phenolsulfonic acid (B component)=3:1

4,4'-Dihydroxydiphenylsulfone (A component):48 mass % sodium hydroxide aqueous solution (C component)=1: 0.75

(4,4'-Dihydroxydiphenylsulfone (A component)+p-phenolsulfonic acid (B component)):(37 mass % formaldehyde aqueous solution (D component))=1:1.25

Synthesis Example 5: Preparation of Condensate (B) (Dispersant E)

Operations were performed in the same way as in Synthesis Example 1 with the exception that a reaction was carried out for 16 hours instead of 4 hours in Synthesis Example 1.

The dispersant E had a weight-average molecular weight of 3,200 (standard polyethylene glycol-equivalent value) upon measurement by GPC (gel permeation chromatography) and had an A component (hydroxyphenol compound):B component (aromatic sulfonic acid compound) molar ratio of 1:1 upon measurement by $^1$H-NMR.

<Preparation of Dispersants F to I>

The following dispersants F to I were prepared.

Dispersant F: Phenolsulfonic acid resin (produced by Konishi Chemical Industry Co., Ltd.)

Dispersant G: β-Naphthalenesulfonic acid/formalin condensate sodium salt (produced by Kao Corporation; product name: DEMOL RN)

Dispersant H: Sodium phenolsulfonate (produced by Junsei Chemical Co., Ltd.)

Dispersant I: Nonylphenol (produced by Nicca Chemical Co., Ltd.)

Example 1

<Production of Dispersion Liquid>

After adding 140 g of pure water and hydrochloric acid into a 500 mL plastic bottle such that the pH was 2.0, 60 g of ethanol (solvent (C)) was further added so as to produce 200 g of a solution. A 30 mass % alkaline solution of the dispersant A produced such as to achieve mass ratios (nanocarbon/dispersant) (carbon material (A)/condensate (B)) in Table 1 was added to the solution and then SGCNTs were further added to thereby produce a mixture in a wet state in which the SGCNTs were 0.40 mass % and the pH was 2.0.

The mixture was stirred by a homo mixer at 6,000 rpm for 30 minutes while the plastic bottle was cooled to 25° C. in a water bath to yield a crude dispersion liquid.

The obtained crude dispersion liquid was subjected to 10 passes of treatment at 100 MPa in a wet jet mill (producer: Yoshida Kikai Co., Ltd.; product name: NanoVater) while being cooled to 25° C. to thereby obtain a CNT paste as a dispersion liquid.

The CNT paste (dispersion liquid) was used to perform various evaluations.

<Preparation of Dye Solution>

A sensitizing dye solution (concentration: 0.4 mM) was prepared as a dye solution.

Note that a ruthenium complex (produced by Solaronix; product name: N719) was used as the sensitizing dye, and a solvent of acetonitrile:tert-butanol=1:1 was used as the solvent.

<Production of Photoelectrode>

An isopropyl alcohol solution of titanium isopropoxide having a concentration of 5 mM was applied onto an ITO-PEN film (50 mm×50 mm, 15 Ω/sq.) by bar coating and was then dried at 150° C. in an inert oven (produced by Yamato Scientific Co., Ltd.) for 15 minutes. A heat curable Ag paste (produced by Toyochem Co., Ltd.) was used to perform printing using a screen printing machine (SFA-PC610CTN produced by Seria Corporation) and was heated at 130° C. in an inert oven (produced by Yamato Scientific Co., Ltd.) for 30 minutes to form a lead-out electrode (thickness: 8 μm). In addition, an aqueous titanium oxide paste (PECC-AW1-01 produced by Peccell Technologies, Inc.) was applied by a screen printing machine and was then dried at 150° C. in an inert oven (produced by Yamato Scientific Co., Ltd.) for 15 minutes to form a porous semiconductor layer (titanium oxide layer thickness: 8 μm).

The base material on which the porous semiconductor layer had been formed was placed in the dye solution (50 cm-square vat) and was immersed therein at 40° C. for 2 hours. After this immersion, washing was performed using ethanol solution and then drying was performed under reduced pressure at 40° C. for 24 hours to produce a photoelectrode.

<Production of Counter Electrode>

The CNT paste (dispersion liquid) produced as described above was applied onto an ITO-PEN film (50 mm×50 mm, 15 Ω/sq.) by screen printing using a 100-mesh screen and was then dried in an air atmosphere at 125° C. for 15 minutes using an inert oven (produced by Yamato Scientific Co., Ltd.) to form a coating film. Thereafter, the base material onto which the CNT paste (dispersion liquid) had been applied was washed using an alkaline rinsing liquid (NaOH solution, pH 10) and was dried under conditions of 2 hours at 60° C. under reduced pressure to produce a counter electrode having the presently disclosed conductive film formed on the PEN base material (PEN+ITO+presently disclosed conductive film).

<Production of Organic Solar Cell>

Inside a vacuum bonding apparatus, a sealant (polybutylene photocurable resin and 8 mass % insulating spacer resin (25 μm)) was applied onto the produced photoelectrode by a dispenser such as to pass around the perimeter of the photoelectrode once with a sealant width of 0.9 mm and height of 30 μm after bonding, and then an electrolyte solution was applied onto the titanium oxide layer (porous semiconductor fine particulate layer). Bonding was then performed by setting up the counter electrode inside the vacuum bonding apparatus, performing overlapping thereof under vacuum, and then curing the sealant through UV irradiation by a metal halide lamp with an integrated light intensity of 3,000 mJ/cm$^2$. The vacuum was released to atmospheric pressure so as to remove an organic solar cell from the apparatus.

Examples 2 to 9 and Comparative Examples 1 to 4

Production of a dispersion liquid, preparation of a dye solution, production of a photoelectrode, production of a counter electrode, production of an organic solar cell, and various evaluations were performed in the same way as in Example 1 with the exception that, in Example 1, production of a dispersion liquid and production of a counter electrode were performed under conditions indicated for each of Examples 2 to 9 and Comparative Examples 1 to 4 in Table 1 instead of performing production of a dispersion liquid (CNT paste) under conditions indicated for Example 1 in Table 1. The results are shown in Table 1.

Note that deionized water (pH 7.0) was used as the "neutral rinsing liquid" indicated in Table 1.

A more specific description is provided below.

Example 2

Production of a dispersion liquid, preparation of a dye solution, production of a photoelectrode, production of a counter electrode, production of an organic solar cell, and various evaluations were performed in the same way as in Example 1 with the exception that a neutral rinsing liquid was used instead of an alkaline rinsing liquid in Example 1. The results are shown in Table 1.

Example 3

Production of a dispersion liquid, preparation of a dye solution, production of a photoelectrode, production of a counter electrode, production of an organic solar cell, and various evaluations were performed in the same way as in Example 2 with the exception that the "HiPco" single-walled carbon nanotubes were used instead of the "SGCNT" single-walled carbon nanotubes in Example 2. The results are shown in Table 1.

Example 4

Production of a dispersion liquid, preparation of a dye solution, production of a photoelectrode, production of a counter electrode, production of an organic solar cell, and various evaluations were performed in the same way as in Example 2 with the exception that 4.00 mass % of Ketjenblack (KB) was used instead of 0.40 mass % of single-walled carbon nanotubes (SGCNTs) in Example 2. The results are shown in Table 1.

Example 5

Production of a dispersion liquid, preparation of a dye solution, production of a photoelectrode, production of a counter electrode, production of an organic solar cell, and various evaluations were performed in the same way as in Example 1 with the exception that a mixture of single-walled carbon nanotubes (SGCNTs) and Ketjenblack (KB) (mixing ratio (mass %):80/20) was used instead of single-walled carbon nanotubes (SGCNTs) in Example 1. The results are shown in Table 1.

Example 6

Production of a dispersion liquid, preparation of a dye solution, production of a photoelectrode, production of a counter electrode, production of an organic solar cell, and various evaluations were performed in the same way as in Example 2 with the exception that the dispersant B was used instead of the dispersant A in Example 2. The results are shown in Table 1.

Example 7

Production of a dispersion liquid, preparation of a dye solution, production of a photoelectrode, production of a counter electrode, production of an organic solar cell, and various evaluations were performed in the same way as in Example 2 with the exception that the dispersant C was used instead of the dispersant A in Example 2. The results are shown in Table 1.

Example 8

Production of a dispersion liquid, preparation of a dye solution, production of a photoelectrode, production of a counter electrode, production of an organic solar cell, and various evaluations were performed in the same way as in Example 2 with the exception that the dispersant D was used instead of the dispersant A in Example 2. The results are shown in Table 1.

Example 9

Production of a dispersion liquid, preparation of a dye solution, production of a photoelectrode, production of a counter electrode, production of an organic solar cell, and various evaluations were performed in the same way as in Example 2 with the exception that the dispersant E was used instead of the dispersant A in Example 2. The results are shown in Table 1.

Comparative Example 1

Production of a dispersion liquid was performed in the same way as in Example 2 with the exception that 20 mass equivalents of the dispersant F relative to the carbon material was used instead of 2.5 mass equivalents of the dispersant A relative to the carbon material in Example 2. The results are shown in Table 1. Note that a coating film could not be obtained by screen printing due to poor dispersibility, and thus other evaluations were not performed.

Comparative Example 2

Production of a dispersion liquid, preparation of a dye solution, production of a photoelectrode, production of a counter electrode, production of an organic solar cell, and various evaluations were performed in the same way as in Example 2 with the exception that 20 mass equivalents of the dispersant G relative to the carbon material was used instead of 2.5 mass equivalents of the dispersant A relative to the carbon material in Example 2. The results are shown in Table 1.

Comparative Example 3

Production of a dispersion liquid, preparation of a dye solution, production of a photoelectrode, production of a counter electrode, production of an organic solar cell, and various evaluations were performed in the same way as in Example 2 with the exception that 20 mass equivalents of the dispersant H relative to the carbon material was used instead of 2.5 mass equivalents of the dispersant A relative to the carbon material in Example 2. The results are shown in Table 1.

Comparative Example 4

Production of a dispersion liquid, preparation of a dye solution, production of a photoelectrode, production of a counter electrode, production of an organic solar cell, and various evaluations were performed in the same way as in Example 2 with the exception that 20 mass equivalents of the dispersant I relative to the carbon material was used instead of 2.5 mass equivalents of the dispersant A relative to the carbon material in Example 2. The results are shown in Table 1.

TABLE 1

|  |  |  | Example 1 | Example 2 | Example 3 | Example 4 | Example 5 | Example 6 | Example 7 |
|---|---|---|---|---|---|---|---|---|---|
| Dispersion liquid | Carbon material | Type | SGCNT | SGCNT | Hapco | KB | SGCNT/KB | SGCNT | SGCNT |
|  |  | Mixing ratio (mass %) | 100 | 100 | 100 | 100 | 80/20 | 100 | 100 |
|  |  | Amount (mass %) | 0.40 | 0.40 | 0.40 | 4.00 | 0.40 | 0.40 | 0.40 |
|  | Dispersant | Type | A | A | A | A | A | B | C |
|  |  | Molar ratio (A component:B component) | 1:1 | 1:1 | 1:1 | 1:1 | 1:1 | 1:1 | 1:3 |
|  |  | Mw | 790 | 790 | 790 | 790 | 790 | 2400 | 1130 |
|  |  | Mn/Mw | 1.1 | 1.1 | 1.1 | 1.1 | 1.1 | 1.1 | 1.1 |
|  |  | Mass ratio (carbon material/dispersant) | 0.4/1.0 | 0.4/1.0 | 0.4/1.0 | 0.4/1.0 | 0.4/1.0 | 0.4/1.0 | 0.4/1.0 |
|  |  | pH | 2 | 2 | 2 | 2 | 2 | 2 | 2 |
|  |  | Rinsing liquid | Alkaline | Neutral | Neutral | Neutral | Alkaline | Neutral | Neutral |
| Evaluation results |  | Dispersibility | A | A | A | A | A | A | A |
|  |  | Screen printing properties (coatability) | A | A | A | B | A | A | A |
|  |  | Base material close adherence | A | A | A | B | B | B | B |
|  |  | Conversion efficiency | A | B | B | B | B | B | B |

|  |  |  | Example 8 | Example 9 | Comparative Example 1 | Comparative Example 2 | Comparative Example 3 | Comparative Example 4 |
|---|---|---|---|---|---|---|---|---|
| Dispersion liquid | Carbon material | Type | SGCNT | SGCNT | SGCNT | SGCNT | SGCNT | SGCNT |
|  |  | Mixing ratio (mass %) | 100 | 100 | 100 | 100 | 100 | 100 |
|  |  | Amount (mass %) | 0.40 | 0.40 | 0.40 | 0.40 | 0.40 | 0.40 |
|  | Dispersant | Type | D | E | F | G | H | I |
|  |  | Molar ratio (A component:B component) | 3:1 | 1:1 | — | — | — | — |
|  |  | Mw | 870 | 3200 | 20000 | 100000 | 196 | 220 |
|  |  | Mn/Mw | 1.1 | 1.3 | — | — | — | — |
|  |  | Mass ratio (carbon material/dispersant) | 0.4/1.0 | 0.4/1.0 | 0.4/8.0 | 0.4/8.0 | 0.4/8.0 | 0.4/8.0 |
|  |  | pH | 2 | 2 | 2 | 2 | 2 | 2 |
|  |  | Rinsing liquid | Neutral | Neutral | — | Neutral | Neutral | Neutral |
| Evaluation results |  | Dispersibility | A | A | C | B | B | B |
|  |  | Screen printing properties (coatability) | A | A | — | B | C | C |
|  |  | Base material close adherence | A | A | — | C | C | C |
|  |  | Conversion efficiency | B | B | — | C | D | D |

It can be seen from Table 1 that coatability (wettability) with respect to a base material can be improved (screen printing properties can be improved) and a conductive film having high close adherence with a base material can be formed using the dispersion liquids of Examples 1 to 9.

INDUSTRIAL APPLICABILITY

According to the present disclosure, it is possible to provide a dispersion liquid that can improve coatability (wettability) with respect to a base material and can form a conductive film having high close adherence with a base material.

Moreover, according to the present disclosure, it is possible to provide a conductive film that has high close adherence with a base material and a production method thereof, an electrode that includes this conductive film and has high electrical conductivity, and a solar cell that includes this electrode and has high conversion efficiency.

REFERENCE SIGNS LIST 1 first base material
2 photoelectrode
3 first substrate
4 electrolyte layer
5 second base material
6 counter electrode
7 second substrate
8 partition
9 cell connector (conductive resin composition)
12A first lead-out electrode
12B second lead-out electrode
21 photoelectrode conductive layer
22 porous semiconductor fine particulate layer
61 counter electrode conductive layer
62 catalyst layer
100 DSC module

The invention claimed is:

1. A solar cell comprising an electrode, wherein
the electrode comprises a conductive film,
the conductive film is obtained using a dispersion liquid,
the dispersion liquid comprises: a carbon material (A); a condensate (B) of an aromatic sulfonic acid compound, a hydroxyphenol compound, and an aldehyde compound; and a solvent (C), and
the solar cell is an organic solar cell.

* * * * *